United States Patent
Furukawa

(10) Patent No.: US 7,472,371 B2
(45) Date of Patent: Dec. 30, 2008

(54) DESCRIPTION STYLE CONVERSION METHOD, PROGRAM, AND SYSTEM OF LOGIC CIRCUIT

(75) Inventor: Eiji Furukawa, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 233 days.

(21) Appl. No.: 11/540,654

(22) Filed: Oct. 2, 2006

(65) Prior Publication Data

US 2008/0005705 A1 Jan. 3, 2008

(30) Foreign Application Priority Data

Jun. 29, 2006 (JP) .............................. 2006-179015

(51) Int. Cl.
*G06F 17/50* (2006.01)
(52) U.S. Cl. ...................................................... 716/18
(58) Field of Classification Search .................. None
See application file for complete search history.

(56) References Cited

U.S. PATENT DOCUMENTS 5,867,395 A * 2/1999 Watkins et al. ................ 716/18

2007/0174805 A1 * 7/2007 Hsu et al. ...................... 716/18

FOREIGN PATENT DOCUMENTS

| JP | 9-311882 | 12/1997 |
| JP | 11-85832 | 3/1999 |
| JP | 2004-287669 | 10/2004 |

* cited by examiner

*Primary Examiner*—Leigh Marie Garbowski
(74) *Attorney, Agent, or Firm*—Staas & Halsey LLP

(57) ABSTRACT

A logic circuit described in the netlist style HDL and a lower-level logic circuit (lower-level module) of a library which corresponds to an instance in the logic circuit and is described in the RTL style are read to a logic circuit storage unit by a logic circuit reading unit. A library hierarchical expansion unit performs a process of expanding a hierarchy of the library with respect to the instance in the logic circuit and converts it to the RTL style. An assignment statement eliminating unit replaces and eliminates an assignment statement in the logic circuit, which is converted to the RTL style. A logic circuit output unit outputs the logic circuit, which has undergone the conversion, in the RTL style. If the logic circuit of the library is described in the netlist style HDL, it is converted to an RTL style HDL as well as the case of the logic circuit.

21 Claims, 85 Drawing Sheets

FIG. 5

```
1   module DESIGN(d,s,c,r,q);
2   input d;
3   input s;
4   input c;
5   input r;
6   output q;
7   wire n;
8   wire qb;
9   MUX i1(.a(d), .b(qb), .s(s), .o(n));
10  DFF i2(.d(n), .c(c), .r(r), .q(q), .qb(qb));
    endmodule
```

```
1  module MUX(a, b, s, o);
    input a;
    input b;
    input s;
5   output o;
    wire a1;
    wire b1;
    wire s1;
    NOT i1(.a(s), .o(s1));
10  AND i2(.a(a), .b(s), .o(a1));
    AND i3(.a(b), .b(s1), .o(b1));
    OR  i4(.a(a1), .b(b1), .o(o));
    endmodule 15  module NOT(a,o);
    input a;
    output o;
    assign o = ~a;
    endmodule
```

```
20  module AND(a, b, o);
      input a;
      input b;
      output o;
      assign o = a & b;
25  endmodule module OR(a, b, o);
      input a;
      input b;
      output o;
30    assign o = a | b;
    endmodule
```

```
    module DFF(d, c, r, q, qb);
35    input d;
      input c;
      input r;
      output q;
      output qb;
      reg q;
40    always @(posedge c or negedge r)
        if (r==1'b0)
          q<=1'b0;
        else
          q<=d;
45    assign qb = ~q;
    endmodule
```

FIG. 7

```
1  module MUX(a, b, s, o);
2  input a;
3  input b;
4  input s;
5  output o;
6  assign o = (a & s) | (b & ~s);
7  endmodule
```

16

```
8   module DFF(d, c, r, q, qb);
9   input d;
10  input c;
11  input r;
12  output q;
13  output qb;
14  reg q;
15  always @(posedge c or negedge r)
16    if (r==1'b0)
17      q<=1'b0;
18    else
19      q<=d;
20  assign qb = ~q;
21  endmodule
```

```
module DESIGN(d, s, c, r, q);
input d;
input s;
input c;
input r;
output q;
reg i2_q;
assign q = i2_q;
always @(posedge c or negedge r)
   if (r == 1'b0)
      i2_q <= 1'b0;
   else
      i2_q <= (d & s) | (i2_q & ~s);
endmodule
```

FIG. 15A

14
MUX i1(.a(d), .o(n), ...);

FIG. 15B 16
1  module MUX(a, o, ...);
2  input a;
3  output o;

FIG. 15C 60-1
1  wire i1__a;
2  assign i1__a=d;
3  wire i1__o;
4  assign n=i1__o;

```
DFF i2(.q(q), ... );
```

```
1  module DFF(q, ... );
2  output q;
3  reg q;
   ...
```

FIG. 16C 60-1A

```
1  reg i2_q;
2  assign q = i2_q;
```

FIG. 20A

```
                                14
FUNC i1(........);
```

FIG. 20B

```
                                16
1  module FUNC(........);
2  function[7:0]sl;
3  input[7:0]data;
4  sl=data<<1;
5  endfunction;
```

FIG. 20C

```
                                62
1  function[7:0]i1__sl;
2  input[7:0]data;
3  i1__sl=data<<1;
4  endfunction;
```

FIG. 27A 60-4

1. assign net1=~(in1 &in2);
2. assign net2=in1 | in2;
3. assign out1=~(net1 &net2);

FIG. 27B 60-5 assign out1=~(~(in1 &in2) &(in1 | in2));

FIG. 28A

| | ORDER | UPPER-LEVEL EXPRESSION | CONVERSION EXPRESSION |
|---|---|---|---|
| 64 | 1 | 1'b0 & n | 1'b0 |
| | 2 | 1'b1 & n | n |
| | 3 | n & n | n |
| 66 | 4 | n & ~n | 1'b0 |
| | 5 | 1'b0 \| n | n |
| | 6 | 1'b1 \| n | 1'b1 |
| | 7 | n \| n | n |
| | 8 | n \| ~n | 1'b1 |
| 67 | 9 | ~1'b0 | 1'b1 |
| | 10 | ~1'b1 | 1'b0 |
| 68 | 11 | ~~n | n |
| | 12 | 1'b0 ^ n | n |
| | 13 | 1'b1 ^ n | ~n |
| | 14 | n ^ n | 1'b0 |
| | 15 | n ^ ~n | 1'b1 |
| | 16 | 1'b0 ? n:m | m |
| | 17 | 1'b1 ? n:m | n |

FIG. 28B

| SYMBOL | MEANING |
|---|---|
| ~ | NOT |
| & | AND |
| \| | OR |
| ? | CONDITIONAL OPERATION |
| n'b | n-BIT BINARY |
| ^ | EXCLUSIVE OR |

70

FIG. 29A 60-6
1 | assign net1=~in1;
2 | assign net2=in1;
3 | assign out1=~(net1 & net2);

FIG. 29B 60-7
assign out1=~(~in1 & in1);

FIG. 29C 60-8
assign out1=~1'b0;

FIG. 29D 60-9
assign out1=1'b1;

FIG. 30A 60-10

1  assign #2 net1=~in1;
2  assign    out1=~net1;
3  assign #3 out2=net1;

FIG. 30B 60-11

1  assign #2 out1=~(~in1);
2  assign #(3+2) out2=~in1;

FIG. 30C 60-12

1  assign #2 out1=in1;
2  assign #5 out2=~in1;

```
wire i1_a;
assign i1_a = d;
wire i1_b;
assign i1_b = qb;
wire i1_s;
assign i1_s = s;
wire i1_o;
assign n = i1_o;
assign i1_o = (i1_a & i1_s) | (i1_b & ~i1_s);
```

74

```
wire i2_d;
assign i2_d = n;
wire i2_c;
assign i2_c = c;
wire i2_r;
assign i2_r = r;
reg i2_q;
assign q = i2_q;
wire i2_qb;
assign qb = i2_qb;
always @(posedge i2_c or negedge i2_r)
   if (i2_r == 1'b0)
      i2_q <= 1'b0;
   else
      i2_q <= i2_d;
assign i2_qb = ~i2_q;
```

```
module DESIGN(d, s, c, r, q);
input d;
input s;
input c;
input r;
output q;
wire n;
wire qb;
wire i1_a;         ← S4
assign i1_a = d;   ← S1,S4
wire i1_b;
assign i1_b = qb;
wire i1_s;
assign i1_s = s;
wire i1_o;
assign n = i1_o;
assign i1_o = (i1_a & i1_s) | (i1_b & ~i1_s);   ← S2,S3
wire i2_d;
assign i2_d = n;
wire i2_c;
assign i2_c = c;
wire i2_r;
assign i2_r = r;
reg i2_q;
assign q = i2_q;
wire i2_qb;
assign qb = i2_qb;
always @(posedge i2_c or negedge i2_r)
   if (i2_r == 1'b0)
      i2_q <= 1'b0;
   else
      i2_q <= i2_d;
assign i2_qb = ~i2_q;
endmodule
```

Lines 9, 10, 17 are marked within bracket 72. Bracket 74 covers the i2 section.

S1: FOCUS ON assign i1_a = d; IN LOOP 2.
S2: FOCUS ON EXPRESSION USING i1_a IN LOOP 3.
S3: REPLACE assign i1_o = (i1_a & i1_s) | (i1_b & ~i1_s); BY assign i1_o = (d & i1_s) | (i1_b & ~i1_s);.
S4: SINCE ALL THE PART USING i1_a WAS REPLACED, ELIMINATE wire i1_a; AND assign i1_a = d;.

```
module DESIGN(d, s, c, r, q);
input d;
input s;
input c;
input r;
output q;
wire n;
wire qb;
wire i1_b;               ← S8
assign i1_b = qb;        ← S5,S8
wire i1_s;
assign i1_s = s;
wire i1_o;
assign n = i1_o;
assign i1_o = (d & i1_s) | (i1_b & ~i1_s);   ← S6,S7
wire i2_d;
assign i2_d = n;
wire i2_c;
assign i2_c= c;
wire i2_r;
assign i2_r = r;
reg i2_q;
assign q = i2_q;
wire i2_qb;
assign qb = i2_qb;
always @(posedge i2_c or negedge i2_r)
   if (i2_r == 1'b0)
      i2_q <= 1'b0;
   else
      i2_q <= i2_d;
assign i2_qb = ~i2_q;
endmodule
```

(line numbers 9, 10, 15 shown at left)

S5: FOCUS ON assign i1_b = qb; IN LOOP 2.

S6: FOCUS ON EXPRESSION USING i1_b IN LOOP 3.

S7: REPLACE assign i1_o = (d & i1_s) | (i1_b & ~i1_s); BY assign i1_o = (d & i1_s) | (qb & ~i1_s);.

S8: SINCE ALL THE PART USING i1_b WAS REPLACED, ELIMINATE wire i1_b; AND assign i1_b = qb;.

```
module DESIGN(d, s, c, r, q);
input d;
input s;
input c;
input r;
output q;
wire n;
wire qb;
```
9  `wire i1_s;`  ⟵ S12
10 `assign i1_s = s;`  ⟵ S9,S12
```
wire i1_o;
assign n = i1_o;
```
13 `assign i1_o = (d & i1_s) | (qb & ~i1_s);`  ⟵ S10,S11
```
wire i2_d;
assign i2_d = n;
wire i2_c;
assign i2_ c= c;
wire i2_r;
assign i2_r = r;
reg i2_q;
assign q = i2_q;
wire i2_qb;
assign qb = i2_qb;
always @(posedge i2_c or negedge i2_r)
   if (i2_r == 1'b0)
      i2_q <= 1'b0;
   else
      i2_q <= i2_d;
assign i2_qb = ~i2_q;
endmodule
```

S9 : FOCUS ON assign i1_s = s; IN LOOP 2.
S10: FOCUS ON EXPRESSION USING i1_s IN LOOP 3.
S11: REPLACE assign i1_o = (d & i1_s) | (qb & ~i1_s); BY assign i1_o = (d & s) | (qb & ~s);.
S12: SINCE ALL THE PART USING i1_s WAS REPLACED, ELIMINATE wire i1_s; AND assign i1_s = s;.

FIG. 38

```
        module DESIGN(d, s, c, r, q);
        input d;
        input s;
        input c;
        input r;
        output q;
 7      wire n;  ✗  ←——————————————— S16
        wire qb;
        wire i1_o;
10      assign n = i1_o;  ✗  ←———————— S13,S16
        assign i1_o = (d & s) | (qb & ~s);
        wire i2_d;
13      assign i2_d = n;  ←————————————— S14,S15
        wire i2_c;
        assign i2_c = c;
        wire i2_r;
        assign i2_r = r;
        reg i2_q;
        assign q = i2_q ;
        wire i2_qb;
        assign qb = i2_qb;
        always @(posedge i2_c or negedge i2_r)
           if (i2_r == 1'b0)
              i2_q <= 1'b0;
           else
              i2_q <= i2_d;
        assign i2_qb = ~i2_q;
        endmodule
```

S13: FOCUS ON assign n = i1_o; IN LOOP 2.
S14: FOCUS ON EXPRESSION USING n IN LOOP 3.
S15: REPLACE assign i2_d = n; BY assign i2_d = i1_o;.
S16: SINCE ALL THE PART USING n WAS REPLACED, ELIMINATE wire n; AND assign n = i1_o;.

```
module DESIGN(d, s, c, r, q);
input d;
input s;
input c;
input r;
output q;
wire qb;
```
8   `wire i1_o;` ✗ ←──────── S20
9   `assign i1_o = (d & s) | (qb & ~s);` ✗ ←──────── S17,S20
```
wire i2_d;
```
11   `assign i2_d = i1_o;` ←──────── S18,S19
```
wire i2_c;
assign i2_c= c;
wire i2_r;
assign i2_r = r;
wire i2_q;
assign q = i2_q ;
wire i2_qb;
assign qb = i2_qb;
always @(posedge i2_c or negedge i2_r)
   if (i2_r == 1'b0)
      i2_q <= 1'b0;
   else
      i2_q <= i2_d;
assign i2_qb = ~i2_q;
endmodule
```

S17: FOCUS ON assign i1_o = (d & s) | (qb & ~s); IN LOOP 2.
S18: FOCUS ON EXPRESSION USING i1_o IN LOOP 3.
S19: REPLACE assign i2_d = i1_o; BY assign i2_d = (d & s) | (qb & ~s);.
S20: SINCE ALL THE PART USING i1_o WAS REPLACED, ELIMINATE wire i1_o; AND assign i1_o = (d & s) | (qb & ~s);.

```
module DESIGN(d, s, c, r, q);
input d;
input s;
input c;
input r;
output q;
wire qb;
wire i2_d; ✗                           ← S24
assign i2_d = (d & s) | (qb & ~s); ✗   ← S21,S24
wire i2_c;
assign i2_c= c;
wire i2_r;
assign i2_r = r;
reg i2_q;
assign q = i2_q ;
wire i2_qb;
assign qb = i2_qb;
always @(posedge i2_c or negedge i2_r)
   if (i2_r == 1'b0)
      i2_q <= 1'b0;
   else
      i2_q <= i2_d;                    ← S22,S23
assign i2_qb = ~i2_q;
endmodule
```

8 (line for wire i2_d)
9 (line for assign i2_d)
22 (line for i2_q <= i2_d)

S21: FOCUS ON assign i2_d = (d & s) | (qb & ~s); IN LOOP 2.
S22: FOCUS ON EXPRESSION USING i2_d IN LOOP 3.
S23: REPLACE i2_q <= i2_d; BY i2_q <= (d & s) | (qb & ~s);.
S24: SINCE ALL THE PART USING i2_d WAS REPLACED, ELIMINATE wire i2_d; AND assign i2_d = (d & s) | (qb & ~s);.

```
   module DESIGN(d, s, c, r, q);
   input d;
   input s;
   input c;
   input r;
   output q;
   wire qb;
8  wire i2_c;                                      ← S28
9  assign i2_c= c;                                 ← S25,S28
   wire i2_r;
   assign i2_r = r;
   reg i2_q;
   assign q = i2_q;
   wire i2_qb;
   assign qb = i2_qb;
16 always @(posedge i2_c or negedge i2_r)          ← S26,S27
      if (i2_r == 1'b0)
         i2_q <= 1'b0;
      else
         i2_q <= (d & s) | (qb & ~s);
   assign i2_qb = ~i2_q;
   endmodule
```

- S25: FOCUS ON assign i2_c = c; IN LOOP 2.
- S26: FOCUS ON EXPRESSION USING i2_c IN LOOP 3.
- S27: REPLACE always @(posedge i2_c or negedge i2_r); BY always @(posedge c or negedge i2_r);.
- S28: SINCE ALL THE PART USING i2_c WAS REPLACED, ELIMINATE wire i2_c; AND assign i2_c = c;.

```
     module DESIGN(d, s, c, r, q);
     input d;
     input s;
     input c;
     input r;
     output q;
     wire qb;
 8   wire i2_r;                              ──── S32
 9   assign i2_r = r;                        ──── S29,S30
     reg i2_q;
     assign q = i2_q;
     wire i2_qb;
     assign qb = i2_qb;
14   always @(posedge c or negedge i2_r)     ──── S30,S31
15     if (i2_r == 1'b0)                     ──── S30,S31
         i2_q <= 1'b0;
       else
         i2_q <= (d & s) | (qb & ~s);
     assign i2_qb = ~i2_q;
     endmodule
```

FIG. 47

S29: FOCUS ON assign i2_r = r; IN LOOP 2.
S30: FOCUS ON EXPRESSION USING i2_r IN LOOP 3.
S31: REPLACE always @(posedge c or negedge i2_r); BY always @(posedge c or negedge r);, AND REPLACE if (i2_r == 1'b0) BY if (r == 1'b0).
S32: SINCE ALL THE PARTS USING i2_r WERE REPLACED, ELIMINATE wire i2_r; AND assign i2_r = r;.

```
                                                    76-9
     module DESIGN(d, s, c, r, q);
     input d;
     input s;
     input c;
     input r;
     output q;
 7   wire qb;  ✗  ←─────────────────────── S38
     reg i2_q;
 9   assign q = i2_q;  ←─────────────────── S33,S34
     wire i2_qb;
11   assign qb = i2_qb;  ✗  ←────────────── S35,S38
     always @(posedge c or negedge r)
        if (r == 1'b0)
           i2_q <= 1'b0;
        else
16         i2_q <= (d & s) | (qb & ~s);  ←── S36,S37
     assign i2_qb = ~i2_q;
     endmodule
```

S33: FOCUS ON assign q = i2_q; IN LOOP 2.

S34: q(LEFT SIDE OF assign) IS EXCLUDED SINCE IT IS input/output AND AN ASSIGNMENT STATEMENT THAT CANNOT BE ELIMINATED.

S35: FOCUS ON assign qb = i2_qb; IN LOOP 2.

S36: FOCUS ON EXPRESSION USING qb IN LOOP 3.

S37: REPLACE i2_q <= (d & s) | (qb & ~s); BY i2_q <= (d & s) | (i2_qb & ~s);.

S38: SINCE ALL THE PART USING qb WAS REPLACED, ELIMINATE wire qb; AND assign qb = i2_qb;.

```
   module DESIGN(d, s, c, r, q);
   input d;
   input s;
   input c;
   input r;
   output q;
   reg i2_q;
   assign q = i2_q;
 9 wire i2_qb;                              ← S42
   always @(posedge c or negedge r)
     if (r == 1'b0)
       i2_q <= 1'b0;
     else
14     i2_q <= (d & s) | (i2_qb & ~s);      ← S40,S41
15 assign i2_qb = ~i2_q;                    ← S39,S42
   endmodule
```

S39: FOCUS ON assign i2_qb = ~i2_q; IN LOOP 2.
S40: FOCUS ON EXPRESSION USING i2_qb IN LOOP 3.
S41: REPLACE i2_q <= (d & s) | (i2_qb & ~s); BY i2_q <= (d & s) | (~i2_q & ~s);.
S42: SINCE ALL THE PART USING i2_qb WAS REPLACED, ELIMINATE wire i2_qb; AND assign i2_qb = ~i2_q;.

```
module DESIGN(d, s, c, r, q);
input d;
input s;
input c;
input r;
output q;
reg i2_q;
assign q = i2_q;
always @(posedge c or negedge r)
   if (r == 1'b0)
      i2_q <= 1'b0;
   else
      i2_q <= (d & s) | (i2_q & ~s);
endmodule
```

FIG. 53

100 —
```
wire i1_a;
assign i1_a = s;
wire i1_o;
assign s1 = i1_o;
assign i1_o = ~i1_a;
```

102 —
```
wire i2_a;
assign i2_a = a;
wire i2_b;
assign i2_b = s;
wire i2_o;
assign a1 = i2_o;
assign i2_o = i2_a & i2_b;
```

104 —
```
wire i3_a;
assign i3_a = b;
wire i3_b;
assign i3_b = s1;
wire i3_o;
assign b1 = i3_o;
assign i3_o = i3_a & i3_b;
```

106 —
```
wire i4_a;
assign i4_a = a1;
wire i4_b;
assign i4_b = b1;
wire i4_o;
assign o = i4_o;
assign i4_o = i4_a | i4_b;
```

FIG. 54

```
108-1~   module MUX(a, b, s, o);
         input a;
         input b;
         input s;
         output o;
         wire a1;
         wire b1;
         wire s1;
      ┌  9  wire i1_a;  ✗  ←─────────── S4
      │  10 assign i1_a = s; ✗ ←─────── S1,S4
 100 ─┤     wire i1_o;
      │     assign s1= i1_o;
      └  13 assign i1_o = ~i1_a; ←───── S2,S3
      ┌    wire i2_a;
      │    assign i2_a = a;
      │    wire i2_b;
 102 ─┤    assign i2_b = s;
      │    wire i2_o;
      │    assign a1 = i2_o;
      └    assign i2_o = i2_a & i2_b;
      ┌    wire i3_a;
      │    assign i3_a = b;
      │    wire i3_b;
 104 ─┤    assign i3_b = s1;
      │    wire i3_o;
      │    assign b1 = i3_o;
      └    assign i3_o = i3_a & i3_b;
      ┌    wire i4_a;
      │    assign i4_a = a1;
      │    wire i4_b;
 106 ─┤    assign i4_b = b1;
      │    wire i4_o;
      │    assign o = i4_o;
      └    assign i4_o = i4_a | i4_b;
           endmodule
```

S1: FOCUS ON assign i1_a = s; IN LOOP 2.
S2: FOCUS ON EXPRESSION USING i1_a IN LOOP 3.
S3: REPLACE assign i1_o = ~i1_a; BY assign i1_o = ~s;.
S4: SINCE ALL THE PART USING i1_a WAS REPLACED, ELIMINATE wire i1_a; AND assign i1_a = s;.

```
module MUX(a, b, s, o);
input a;
input b;
input s;
output o;
wire a1;
wire b1;
wire s1;           ⟵ S8
wire i1_o;
assign s1= i1_o;   ⟵ S5,S8
assign i1_o = ~s;
wire i2_a;
assign i2_a = a;
wire i2_b;
assign i2_b = s;
wire i2_o;
assign a1 = i2_o;
assign i2_o = i2_a & i2_b;
wire i3_a;
assign i3_a = b;
wire i3_b;
assign i3_b = s1;   ⟵ S6,S7
wire i3_o;
assign b1 = i3_o;
assign i3_o = i3_a & i3_b;
wire i4_a;
assign i4_a = a1;
wire i4_b;
assign i4_b = b1;
wire i4_o;
assign o = i4_o;
assign i4_o = i4_a | i4_b;
endmodule
```

- 8 (wire s1 line)
- 100-1 { 10 (assign s1 line)
- 102 (i2 block)
- 104 { 22 (assign i3_b line)
- 106 (i4 block)

S5: FOCUS ON assign s1 = i1_o; IN LOOP 2.
S6: FOCUS ON EXPRESSION USING s1 IN LOOP 3.
S7: REPLACE assign i3_b = s1; BY assign i3_b = i1_o;.
S8: SINCE ALL THE PART USING s1 WAS REPLACED, ELIMINATE wire s1; AND assign s1 = i1_o;.

FIG. 58

```
                    108-3 module MUX(a, b, s, o);
          input a;
          input b;
          input s;
          output o;
          wire a1;
          wire b1;
100-2 { 8  wire i1_o;      ✗ ←────────── S12
       { 9  assign i1_o = ~s; ✗ ←─────── S9,S12
          wire i2_a;
          assign i2_a = a;
          wire i2_b;
          assign i2_b = s;
 102 {    wire i2_o;
          assign a1 = i2_o;
          assign i2_o = i2_a & i2_b;
          wire i3_a;
          assign i3_a = b;
          wire i3_b;
 104 { 20 assign i3_b = i1_o;  ←──────── S10,S11
          wire i3_o;
          assign b1 = i3_o;
          assign i3_o = i3_a & i3_b;
          wire i4_a;
          assign i4_a = a1;
          wire i4_b;
 106 {    assign i4_b = b1;
          wire i4_o;
          assign o = i4_o;
          assign i4_o = i4_a | i4_b;
          endmodule
```

S9 : FOCUS ON assign i1_o = ~s; IN LOOP 2.
S10: FOCUS ON EXPRESSION USING i1_o IN LOOP 3.
S11: REPLACE assign i3_b = i1_o; BY assign i3_b = ~s;.
S12: SINCE ALL THE PART USING i1_o WAS REPLACED, ELIMINATE wire i1_o; AND assign i1_o = ~s;.

```
module MUX(a, b, s, o);
input a;
input b;
input s;
output o;
wire a1;
wire b1;
```
{ 8  `wire i2_a;`  ✗ ← S16
102 { 9  `assign i2_a = a;`  ✗ ← S13,S16
```
wire i2_b;
assign i2_b = s;
wire i2_o;
assign a1 = i2_o;
```
{ 14  `assign i2_o = i2_a & i2_b;` ← S14,S15
```
wire i3_a;
assign i3_a = b;
wire i3_b;
```
104 {
```
assign i3_b = ~s;
wire i3_o;
assign b1 = i3_o;
assign i3_o = i3_a & i3_b;
wire i4_a;
assign i4_a = a1;
wire i4_b;
```
106 {
```
assign i4_b = b1;
wire i4_o;
assign o = i4_o;
assign i4_o = i4_a | i4_b;
endmodule
```

S13: FOCUS ON assign i2_a = a; IN LOOP 2.
S14: FOCUS ON EXPRESSION USING i2_a IN LOOP 3.
S15: REPLACE assign i2_o = i2_a & i2_b; BY assign i2_o = a & i2_b;.
S16: SINCE ALL THE PART USING i2_a WAS REPLACED, ELIMINATE wire i2_a; AND assign i2_a = a;.

FIG. 62

```
                                    108-5
        module MUX(a, b, s, o);
        input a;
        input b;
        input s;
        output o;
        wire a1;
        wire b1;
     8  wire i2_b;  ✗ ←──────────────── S20
     9  assign i2_b = s;  ✗ ←────────── S17,S20
102-1   wire i2_o;
        assign a1 = i2_o;
    12  assign i2_o = a & i2_b; ←────── S18,S19
        wire i3_a;
        assign i3_a = b;
        wire i3_b;
104     assign i3_b = ~s;
        wire i3_o;
        assign b1 = i3_o;
        assign i3_o = i3_a & i3_b;
        wire i4_a;
        assign i4_a = a1;
        wire i4_b;
106     assign i4_b = b1;
        wire i4_o;
        assign o = i4_o;
        assign i4_o = i4_a | i4_b;
        endmodule
```

S17: FOCUS ON assign i2_b = s; IN LOOP 2.
S18: FOCUS ON EXPRESSION USING i2_b IN LOOP 3.
S19: REPLACE assign i2_o = a & i2_b; BY assign i2_o = a & s;.
S20: SINCE ALL THE PART USING i2_b WAS REPLACED, ELIMINATE wire i2_b; AND assign i2_b = s;.

```
module MUX(a, b, s, o);
input a;
input b;
input s;
output o;
wire a1;         ⟵──────── S24
wire b1;
wire i2_o;
assign a1 = i2_o;  ⟵────── S21,S24
assign i2_o = a & s;
wire i3_a;
assign i3_a = b;
wire i3_b;
assign i3_b = ~s;
wire i3_o;
assign b1 = i3_o;
assign i3_o = i3_a & i3_b;
wire i4_a;
assign i4_a = a1;  ⟵────── S22,S23
wire i4_b;
assign i4_b = b1;
wire i4_o;
assign o = i4_o;
assign i4_o = i4_a | i4_b;
endmodule
```

- 6 (wire a1 line)
- 102-3 { 9 (wire i2_o / assign a1 / assign i2_o)
- 104 { (i3_a through i3_o block)
- 19 (assign i4_a = a1 line)
- 106 { (i4_a through endmodule block)

S21: FOCUS ON assign a1 = i2_o; IN LOOP 2.
S22: FOCUS ON EXPRESSION USING a1 IN LOOP 3.
S23: REPLACE assign i4_a = a1; BY assign i4_a = i2_o;.
S24: SINCE ALL THE PART USING a1 WAS REPLACED, ELIMINATE wire a1; AND assign a1 = i2_o;.

FIG. 66

```
                    108-7
         module MUX(a, b, s, o);
         input a;
         input b;
         input s;
         output o;
         wire b1;
102-4 ⎧ 7  wire i2_o;  ✗  ←────────────── S28
      ⎩ 8  assign i2_o = a & s;  ✗  ←──── S25,S28
         wire i3_a;
         assign i3_a = b;
         wire i3_b;
         assign i3_b = ~s;
104 ⎨    wire i3_o;
         assign b1 = i3_o;
         assign i3_o = i3_a & i3_b;
         wire i4_a;
    17   assign i4_a = i2_o;  ←────────── S26,S27
         wire i4_b;
106 ⎨    assign i4_b = b1;
         wire i4_o;
         assign o = i4_o;
         assign i4_o = i4_a | i4_b;
         endmodule
```

S25: FOCUS ON assign i2_o = a & s; IN LOOP 2.
S26: FOCUS ON EXPRESSION USING i2_o IN LOOP 3.
S27: REPLACE assign i4_a = i2_o; BY assign i4_a = a & s;.
S28: SINCE ALL THE PART USING i2_o WAS REPLACED, ELIMINATE wire i2_o; AND assign i2_o = a & s;.

FIG. 68

```
                108-8
         module MUX(a, b, s, o);
         input a;
         input b;
         input s;
         output o;
         wire b1;
    ⎛ 7  wire i3_a;  ✕  ←──────── S32
    ⎜ 8  assign i3_a = b;  ✕  ←── S29,S32
    ⎜    wire i3_b;
104⎨    assign i3_b = ~s;
    ⎜    wire i3_o;
    ⎜    assign b1 = i3_o;
    ⎝ 13 assign i3_o = i3_a & i3_b;  ←── S30,S31
    ⎛    wire i4_a;
    ⎜    assign i4_a = a & s;
    ⎜    wire i4_b;
106⎨    assign i4_b = b1;
    ⎜    wire i4_o;
    ⎜    assign o = i4_o;
    ⎝    assign i4_o = i4_a | i4_b;
         endmodule
```

S29: FOCUS ON assign i3_a = b; IN LOOP 2.
S30: FOCUS ON EXPRESSION USING i3_a IN LOOP 3.
S31: REPLACE assign i3_o = i3_a & i3_b; BY assign i3_o = b & i3_b;.
S32: SINCE ALL THE PART USING i3_a WAS REPLACED, ELIMINATE wire i3_a; AND assign i3_a = b;.

```
108-9
            module MUX(a, b, s, o);
            input a;
            input b;
            input s;
            output o;
            wire b1;
         7  wire i3_b;  X           ← S36
         8  assign i3_b = ~s;  X    ← S33,S36
104-1       wire i3_o;
            assign b1 = i3_o;
        11  assign i3_o = b & i3_b;  ← S34,S35
            wire i4_a;
            assign i4_a = a & s;
            wire i4_b;
106         assign i4_b = b1;
            wire i4_o;
            assign o = i4_o;
            assign i4_o = i4_a | i4_b;
            endmodule
```

S33: FOCUS ON assign i3_b = ~s ; IN LOOP 2.
S34: FOCUS ON EXPRESSION USING i3_b IN LOOP 3.
S35: REPLACE assign i3_o = b & i3_b; BY assign i3_o = b & ~s;.
S36: SINCE ALL THE PART USING i3_b WAS REPLACED, ELIMINATE wire i3_b; AND assign i3_b = ~s;.

FIG. 72

```
                             108-10
       ┌ module MUX(a, b, s, o);
       │ input a;
       │ input b;
       │ input s;
       │ output o;
    6  │ wire b1;  ✗              ← S40
       │ wire i3_o;
104-2 {8  │ assign b1 = i3_o; ✗   ← S37,S40
       │ assign i3_o = b & ~s;
       │ wire i4_a;
       │ assign i4_a = a & s;
       │ wire i4_b;
106  {13 │ assign i4_b = b1;      ← S38,S39
       │ wire i4_o;
       │ assign o = i4_o;
       │ assign i4_o = i4_a | i4_b;
       └ endmodule
```

- S37: FOCUS ON assign b1 = i3_o; IN LOOP 2.
- S38: FOCUS ON EXPRESSION USING b1 IN LOOP 3.
- S39: REPLACE assign i4_b = b1; BY assign i4_b = i3_o;.
- S40: SINCE ALL THE PART USING b1 WAS REPLACED, ELIMINATE wire b1; AND assign b1 = i3_o;.

FIG. 74

```
module MUX(a, b, s, o);
input a;
input b;
input s;
output o;
wire i3_o;   ✗         ← S44
assign i3_o = b & ~s;  ✗  ← S41,S44
wire i4_a;
assign i4_a = a & s;
wire i4_b;
assign i4_b = i3_o;    ← S42,S43
wire i4_o;
assign o = i4_o;
assign i4_o = i4_a | i4_b;
endmodule
```

S41: FOCUS ON assign i3_o = b & ~s; IN LOOP 2.
S42: FOCUS ON EXPRESSION USING i3_o IN LOOP 3.
S43: REPLACE assign i4_b = i3_o; BY assign i4_b = b & ~s;.
S44: SINCE ALL THE PART USING i3_o WAS REPLACED, ELIMINATE wire i3_o; AND assign i3_o = b & ~s;.

FIG. 76

```
                108-12
       module MUX(a, b, s, o);
       input a;
       input b;
       input s;
       output o;
    6  wire i4_a;  ✕         ←————— S48
    7  assign i4_a = a & s; ✕ ←————— S45,S48
       wire i4_b;
106    assign i4_b = b & ~s;
       wire i4_o;
       assign o = i4_o;
   12  assign i4_o = i4_a | i4_b;  ←————— S46,S47
       endmodule
```

(lines 6, 7, 12 and block 106 bracket the middle section)

S45: FOCUS ON assign i4_a = a & s; IN LOOP 2.
S46: FOCUS ON EXPRESSION USING i4_a IN LOOP 3.
S47: REPLACE assign i4_o = i4_a | i4_b; BY assign i4_o = (a & s) | i4_b;.
S48: SINCE ALL THE PART USING i4_a WAS REPLACED, ELIMINATE wire i4_a; AND assign i4_a = a & s;.

FIG. 78

```
                 108-13 module MUX(a, b, s, o);
        input a;
        input b;
        input s;
        output o;
     ⎧ 6  wire i4_b; ✗  ←——————— S52
     ⎪ 7  assign i4_b = b & ~s; ✗ ←——— S49,S52
106-1⎨    wire i4_o;
     ⎪    assign o = i4_o;
     ⎩ 10 assign i4_o = (a & s) | i4_b; ←— S50,S51
        endmodule
```

S49: FOCUS ON assign i4_b = b & ~s; IN LOOP 2.
S50: FOCUS ON EXPRESSION USING i4_b IN LOOP 3.
S51: REPLACE assign i4_o = (a & s) | i4_b; BY assign i4_o = (a & s) | (b & ~s
S52: SINCE ALL THE PART USING i4_b WAS REPLACED, ELIMINATE wire i4_b; AND assign i4_b = b & ~s;.

S53: FOCUS ON assign o = i4_o; IN LOOP 2.

S54: o(LEFT SIDE OF assign) IS EXCLUDED SINCE IT IS input/output AND IS AN ASSIGNMENT STATEMENT THAT CANNOT BE ELIMINATED.

S55: FOCUS ON assign i4_o = (a & s) | (b & ~s); IN LOOP 2.

S56: FOCUS ON EXPRESSION USING i4_o IN LOOP 3.

S57: REPLACE assign o = i4_o; BY assign o = (a & s) | (b & ~s);.

S58: SINCE ALL THE PART USING i4_o WAS REPLACED, ELIMINATE wire i4_o; AND assign i4_o = (a & s) | (b & ~s);.

```
module MUX(a, b, s, o);
input a;
input b;
input s;
output o;
assign o = (a & s) | (b & ~s);
endmodule
```

DESCRIPTION STYLE CONVERSION METHOD, PROGRAM, AND SYSTEM OF LOGIC CIRCUIT

This application is a priority based on prior application No. JP 2006-179015, filed Jun. 16, 2006, in Japan.

BACKGROUND OF THE INVENTION

1. Field of the Invention

The present invention relates to description style conversion method, program, and system of a logic circuit which enable a high-speed simulation of the logic circuit described by using a hardware description language, and particularly relates to description style conversion method, program, and system of a logic circuit which enable a high-speed simulation by converting a logic circuit described in a netlist style to an RTL style.

2. Description of the Related Arts

Conventionally, text-based designing operations using a hardware description language (HDL; Hardware Description Language) such as Verilog-HDL have been performed as a designing method which is an alternative to a circuit diagram for a large-scale logic circuit. The designing operations by means of the HDL are generally performed in the following procedures.

(1) An HDL file (function description file) is generated by describing functions of circuit modules in a hardware description language in a text editor.
(2) The operation thereof is checked by using an HDL simulator of the HDL file.
(3) A netlist is generated from the operation-checked HDL file by using a logic synthesis tool. In logic designing using such a conventional HDL, they are basically described in an RTL style which is known as an RTL (Register Transfer Level) description; however, a data-path-based circuit or a DFT (Design For Test) circuit which is required to be operated at a high speed in a GHz order is often described in a netlist style which is known as a gate level description. Herein, the RTL description referred to as an RTL style is a description of an HDL expressing logics to be realized by registers and the logic functions between the registers, and the description describes the state of the values of the registers which undergo transitions. The gate level description referred to as a netlist style is a level which describes them in a list expressing gates and cell-based (lower-level modules converted into components and registered in libraries as instances) connection relations in an ASIC, and is used for example when a high speed or a high density which cannot be realized by the RTL description is required. As described above, logic designing of LSI circuits is described in the RTL style and the netlist style by using HDL, and, in designing, whether the functions of the logic circuits of the HDL properly operate or not is examined by use of a logic simulator. Below Patent Documents 1 to 6 are provided as conventional techniques related to simulations of logic circuits described in HDLs.

JP06-348775 provides a system which speeds up a simulation of a transistor/gate level simulation by converting transistors into gates, separating them into combinational circuits and sequential circuits, and converting them into RTL. JP07-129632 provides a system which speeds up a simulation of a gate level simulation by subjecting sequential circuits to clock synchronization by utilizing clock signals, optimizing activation timing of the sequential circuits, and then performing conventional optimization processes. JP10-069505 provides a system which speeds up a simulation of logic circuits simulation by performing an operation of grouping them in event execution units. JP2006-004244 provides a system which speeds up a simulation of a gate level simulation by determining gates which can be eliminated and eliminating them. JP09-311822 provides a system which speeds up a simulation by converting RTL into a netlist, performing deletion of inactive parts of circuits and moving/integrating registers with respect to the netlist, and reconverting it into RTL. JP11-085832 provides a system which speeds up a simulation of an RTL simulation by integrating a condition execution unit and a data computing unit which is subsequent to that.

However, when the operation of a large-scale LSI circuit including many circuits described in the netlist style is to be examined by a logic simulator, there is a problem that examination of the part described in the netlist style takes a lot of time. Specifically, in the case of a general logic simulator, a simulation is performed in an event-driven method; however, in the case of the netlist style, the number of events is considerably increased, and the execution time of the simulator is considerably lengthened. In the event-driven method simulation herein, attention is focused on an element such as a logic gate having a signal change (event), merely the element in the next step of the event generated element is subjected to computing processing, change in the signal is successively transmitted to the next step when the output of the element is changed, and not only logical values but also delay between events can be calculated. The below described systems are provided as systems which solve the problem of the simulation execution time of the netlist style.

(1) Simulation According to Cycle-Based Method

In a simulation of a cycle-based method, delay time of elements is ignored, computing order is statically determined in preprocessing, and, upon execution, computation is performed merely once in each clock cycle. Although timing examination cannot be performed, compared with the event-driven method, the amount of computation is significantly reduced, and operation which is about several tens to a hundred times faster can be performed.

(2) Simulation Using Hardware Emulator

A simulation by means of a hardware emulator is a simulation in which a logic simulator of the event-driven method is made into dedicated hardware, is designed to enhance the parallel property of processing as much as possible, is several ten to several hundred times faster than the logic simulator of the event-driven method, has no restriction on the object circuit, and can perform timing examination. However, the simulation according to the cycle-based method is basically for a synchronous circuit, has restrictions on the description of HDL, and is not general. The hardware emulator is extremely expensive, and therefore the burden in terms of cost is large. Therefore, a system which executes a simulation of logic circuits described in the netlist style at low cost without restrictions of the description of HDL is desired.

SUMMARY OF THE INVENTION

According to the present invention to provide description style conversion method, program, and system of logic circuits which enable a high-speed simulation in the event-driven method by reducing the number of events with respect to HDL described in the netlist style and converting it into the RTL description.

(Method)

The present invention provides a description style conversion method of a logic circuit. The present invention is a description style conversion method of a logic circuit which converts the logic circuit described in a netlist style to a logic circuit described in an RTL style by using a hardware description language, characterized by including a logic circuit reading step in which the logic circuit (module) described in the netlist style is read;

a library reading step in which a lower-level logic circuit (lower-level module) described in the RTL style of a library corresponding to an instance in the logic circuit is read;

a library hierarchical expansion step in which a process of expanding a hierarchy of the library is performed for the instance in the logic circuit, and the logic circuit is converted to the RTL style;

an assignment statement elimination step in which an assignment statement in the logic circuit is replaced and eliminated; and a logic circuit output step in which the logic circuit is output in the RTL style.

Herein, if the logic circuit of the library is described in the netlist style, a library description style conversion step in which the logic circuit is converted to the RTL style is provided. The library description style conversion step includes a logic circuit reading step in which the logic circuit described in the netlist style in a library is read;

a lower-level logic circuit reading step in which the lower-level logic circuit in the library described in the RTL style is read with respect to the instance in the logic circuit;

a library hierarchical expansion step in which a process of expanding a hierarchy of the lower-level logic circuit is performed for the instance in the logic circuit, and the logic circuit is converted to the RTL style;

an assignment statement elimination step in which the assignment statement in the logic circuit is replaced and eliminated; and a module output step in which the logic circuit is output in the RTL style, and the library is rewritten.

The library hierarchical expansion step includes a library specifying step in which the lower-level logic circuit in the library corresponding to the instance in the logic circuit is specified;

a joining step in which, with respect to the instance in the logic circuit, a joining relation between an instance pin and a library port of the lower-level logic circuit in the library corresponding to the instance pin is set;

a declaration copy step in which a data-type declaration except for input/output is extracted from the lower-level logic circuit in the library, and a copy of the declaration is generated;

a function description copy step in which a function description is extracted from the lower-level logic circuit in the library, and a copy of the function description is generated;

a task description copy step in which a task description is extracted from the lower-level logic circuit in the library, and a copy of the task description is generated; and a behavioral description copy step in which a behavioral description is extracted from the lower-level logic circuit in the library, and a copy of the behavioral description is generated.

If the hardware description language is Verilog-HDL, in the joining step, if the library port is an input port,
wire library port name;
assign library port name=expression of instance pin;
are generated corresponding to the instance pin, and,
  if the library port is an output port,
wire library port name;
assign expression of instance pin=library port name;
are generated corresponding to the instance pin; and a name in which the instance name of the logic circuit is connected by an underscore with the library port name before conversion is generated as the library port name.

If the hardware description language is Verilog-HDL, in the declaration copy step, a name in which the instance name of the logic circuit is connected by an underscore with the declaration name before conversion is generated as a declaration name of a copy destination;

in the function description copy step, a name in which the instance name of the logic circuit is connected by an underscore with the function name before conversion is generated as a function name of a copy destination;

in the task description copy step, a name in which the instance name of the logic circuit is connected by an underscore with the task name before conversion is generated as a task name of a copy destination;

in the instance description copy step, a name in which the instance name of the logic circuit is connected by an underscore with the instance name before conversion is generated as an instance name of a copy destination, and a name in which the instance name of a module is connected by an underscore with a variable name before conversion is generated as a variable name in the expression of the instance pin; and, in the behavioral description copy step, an initial statement, an always statement, and an assign statement are extracted as the behavioral description statements from the lower-level logic circuit in the library, and a copy of the statements is generated.

In the assignment statement elimination step, if the left side of the assignment statement is used in another expression, the part used in the other expression is replaced by the right side of the assignment statement, and the assignment statement is eliminated. Furthermore, in the assignment statement elimination step, if the other expression replaced by the right side of the assignment statement is an operation expression, the operation expression is converted to a simplified operation expression in accordance with a predetermined conversion rule.

In the assignment statement elimination step, if a delay is added to the left side of a first assignment statement, and mere the left side of the first assignment statement is used in the right side of a second assignment statement, the delay of the first assignment statement is added to the second assignment statement, the part used in the right side of the second assignment statement is replaced by the right side of the first assignment statement, and the first assignment statement is eliminated.

(Program)

The present invention provides a program for description style conversion of a logic circuit. The program of the present invention is characterized by causing a computer to execute a logic circuit reading step in which a logic circuit described in a netlist style is read by using a hardware description language;

a library reading step in which a lower-level logic circuit described in an RTL style of a library corresponding to an instance in the logic circuit is read;

a library hierarchical expansion step in which a process of expanding a hierarchy of the library is performed for the instance in the logic circuit, and the logic circuit is converted to the RTL style;

an assignment statement elimination step in which an assignment statement in the logic circuit is replaced and eliminated; and a logic circuit output step in which the logic circuit is output in the RTL style.

(System)

The present invention provides a description style conversion system of a logic circuit. The present invention is a description style conversion system of a logic circuit which converts the logic circuit described in a netlist style to a logic circuit described in an RTL style by using a hardware description language, characterized by having a logic circuit reading unit which reads the logic circuit described in the netlist style;

a library reading unit which reads a lower-level logic circuit described in the RTL style of a library corresponding to an instance in the logic circuit;

a library hierarchical expansion unit which performs a process of expanding a hierarchy of the library for the instance in the logic circuit, and converts the logic circuit to the RTL style;

an assignment statement elimination unit which replaces and eliminates an assignment statement in the logic circuit; and a logic circuit output unit which outputs the logic circuit in the RTL style.

According to the present invention, when a simulation of a netlist style HDL is to be performed by a simulator of an event-driven method, the HDL described in the netlist style is converted to a description of an RTL style by performing hierarchical expansion by referencing a library, and, if redundant assignment statements are included, they are replaced and eliminated; thus, the number of events can be reduced, and the simulation can be performed at a high speed. No particular limitation is imposed on the description of the HDL in the netlist style which is an object of the style conversion according to the present invention; thus, it can be simply and readily executed at low cost. If the library is described in the netlist style (in the case of macro library) or if the library includes redundant assignment statements, the library is once converted to a library of the optimal RTL style; thus, even if a plurality of instances of such library are present in the designed logic circuit, same conversions are not required to be repeated many times. Therefore, speed-up of the conversion per se can be expected.

The above and other objects, features, and advantages of the present invention will become more apparent from the following detailed description with reference to the drawings.

BRIEF DESCRIPTION OF THE DRAWINGS

FIG. 5 is an explanatory diagram of a logic circuit described in netlist style HDL to be converted;

FIGS. 6A and 6B are explanatory diagrams of a library described in netlist style HDL;

FIG. 7 is an explanatory diagram of a library converted into RTL style HDL according to the present embodiment;

FIG. 8 is an explanatory diagram of a logic circuit converted into RTL style HDL according to the present embodiment;

FIGS. 15A to 15C are explanatory diagrams showing specific examples of the joining process of an instance pin with a library port;

FIGS. 16A to 16C are explanatory diagrams of a specific example of the joining process in the case in which a library port is declared as a register;

FIGS. 20A to 20C are explanatory diagrams showing a specific example of the function copy process;

FIGS. 27A and 27B are explanatory diagrams showing a specific example of the assignment statement elimination process;

FIGS. 28A and 28B are explanatory diagrams of conversion rules which convert upper-level expressions;

FIGS. 29A to 29D are explanatory diagrams of an assignment statement elimination process accompanied by conversion of upper-level expressions generated in replacement of assignment statements;

FIGS. 30A to 30C are explanatory diagrams showing a specific example of the assignment elimination process in which delays are added;

FIG. 31 is an explanatory diagram in which the instances MUX i1 and DFF i2 in the netlist style logic circuit of FIG. 5 are subjected to library hierarchical expansion;

FIG. 32 is an explanatory diagram of a module work generated in the library hierarchical expansion of FIG. 31;

FIG. 33 is an explanatory diagram of an assignment statement elimination process for FIG. 32;

FIG. 34 is an explanatory diagram of the module work generated by the process of FIG. 33;

FIG. 35 is an explanatory diagram of an assignment statement elimination process for FIG. 34;

FIG. 36 is an explanatory diagram of the module work generated by the process of FIG. 35;

FIG. 37 is an explanatory diagram of an assignment statement elimination process for FIG. 36;

FIG. 38 is an explanatory diagram of the module work generated by the process of FIG. 37;

FIG. 39 is an explanatory diagram of an assignment statement elimination process for FIG. 38;

FIG. 40 is an explanatory diagram of the module work generated by the process of FIG. 39;

FIG. 41 is an explanatory diagram of an assignment statement elimination process for FIG. 40;

FIG. 42 is an explanatory diagram of the module work generated by the library hierarchical expansion of FIG. 41;

FIG. 43 is an explanatory diagram of an assignment statement elimination process for FIG. 42;

FIG. 44 is an explanatory diagram of the module work generated by the process of FIG. 43;

FIG. 45 is an explanatory diagram of an assignment statement elimination process for FIG. 44;

FIG. 46 is an explanatory diagram of the module work generated by the process of FIG. 45;

FIG. 47 is an explanatory diagram of an assignment statement elimination process for FIG. 46;

FIG. 48 is an explanatory diagram of the module work generated by the process of FIG. 47;

FIG. 49 is an explanatory diagram of an assignment statement elimination process for FIG. 48;

FIG. 50 is an explanatory diagram of the module work generated by the process of FIG. 49;

FIG. 51 is an explanatory diagram of an assignment statement elimination process for FIG. 50;

FIG. 52 is an explanatory diagram of the module work finally converted into RTL style by the process of FIG. 51;

FIG. 53 is an explanatory diagram of library hierarchical expansion of the module MUX of FIGS. 6A and 6B;

FIG. 54 is an explanatory diagram of the module work generated by the library hierarchical expansion of FIG. 53;

FIG. 55 is an explanatory diagram of an assignment statement elimination process for FIG. 54;

FIG. 56 is an explanatory diagram of the module work generated by the process of FIG. 55;

FIG. 57 is an explanatory diagram of an assignment statement elimination process for FIG. 56;

FIG. 58 is an explanatory diagram of the module work generated by the process of FIG. 57;

FIG. 59 is an explanatory diagram of an assignment statement elimination process for FIG. 58;

FIG. 60 is an explanatory diagram of the module work generated by the process of FIG. 59;

FIG. 61 is an explanatory diagram of an assignment statement elimination process for FIG. 60;

FIG. 62 is an explanatory diagram of the module work generated by the process of FIG. 61;

FIG. 63 is an explanatory diagram of an assignment statement elimination process for FIG. 62;

FIG. 64 is an explanatory diagram of the module work generated by the process of FIG. 63;

FIG. 65 is an explanatory diagram of an assignment statement elimination process for FIG. 64;

FIG. 66 is an explanatory diagram of the module work generated by the process of FIG. 65;

FIG. 67 is an explanatory diagram of an assignment statement elimination process for FIG. 66;

FIG. 68 is an explanatory diagram of the module work generated by the process of FIG. 67;

FIG. 69 is an explanatory diagram of an assignment statement elimination process for FIG. 68;

FIG. 71 is an explanatory diagram of an assignment statement elimination process for FIG. 70;

FIG. 72 is an explanatory diagram of the module work generated by the process of FIG. 71;

FIG. 73 is an explanatory diagram of an assignment statement elimination process for FIG. 72;

FIG. 74 is an explanatory diagram of the module work generated by the process of FIG. 73;

FIG. 75 is an explanatory diagram of an assignment statement elimination process for FIG. 74;

FIG. 76 is an explanatory diagram of the module work generated by the process of FIG. 75;

FIG. 77 is an explanatory diagram of an assignment statement elimination process for FIG. 76;

FIG. 78 is an explanatory diagram of the module work generated by the process of FIG. 77;

FIG. 79 is an explanatory diagram of an assignment statement elimination process for FIG. 78;

FIG. 81 is an explanatory diagram of an assignment statement elimination process for FIG. 80; and FIG. 82 is an explanatory diagram of the module work finally converted into RTL style by the process of FIG. 81.

DETAILED DESCRIPTION OF THE PREFERRED EMBODIMENTS

Figure 1:
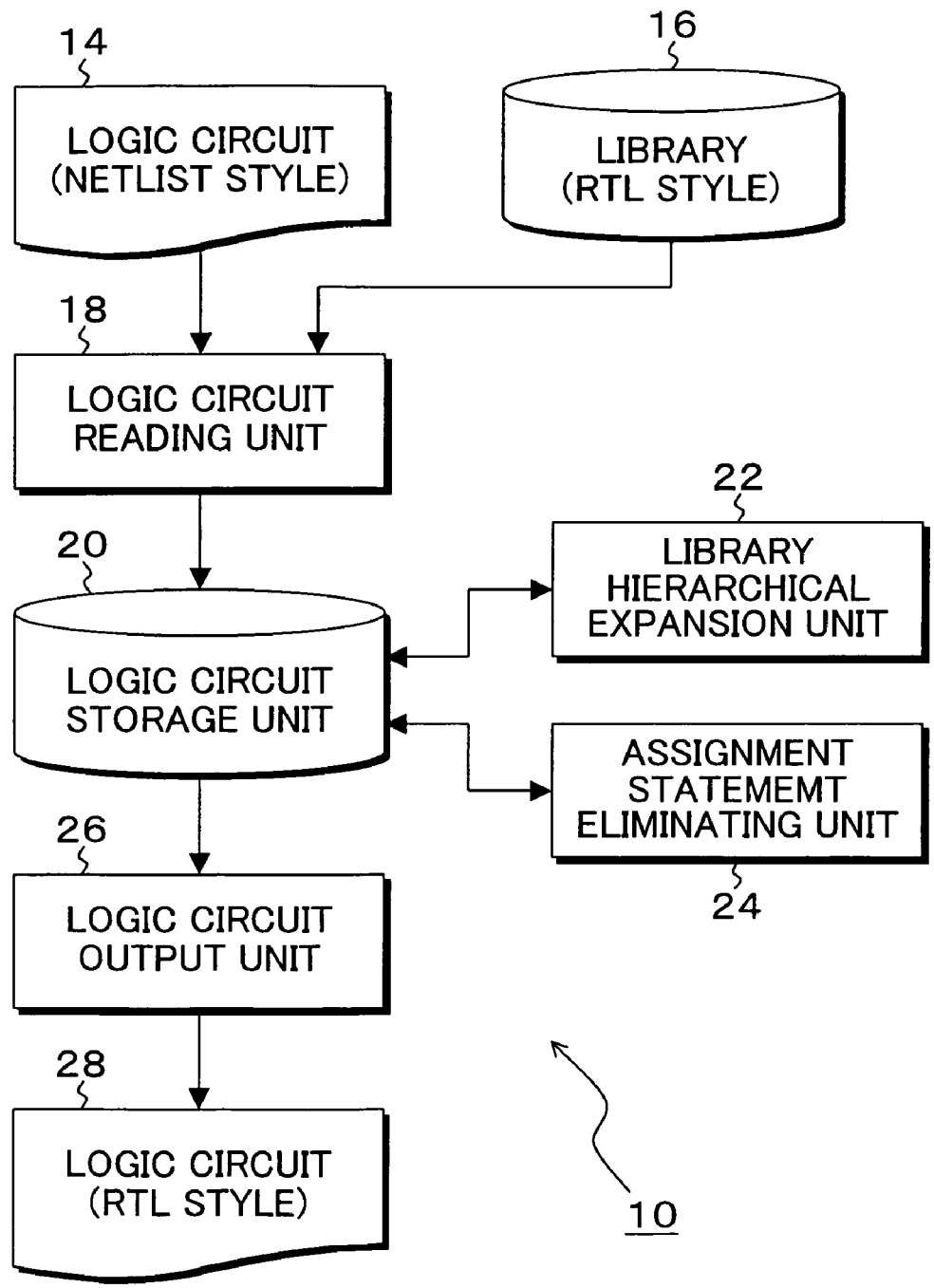
FIG. 1 is a bock diagram of a functional configuration showing an embodiment of a logic circuit description style conversion system according to the present invention.

FIG. 1 is a block diagram of a functional configuration showing an embodiment of a logic circuit description style conversion system according to the present invention. The functional configuration of the present embodiment is realized by executing a logic circuit description style conversion program of the present embodiment by a computer. In FIG. 1, the logic circuit description style conversion system 10 of the present embodiment is composed of a logic circuit reading unit 18, a logic circuit storage unit 20, a library hierarchical expansion unit 22, an assignment statement eliminating unit 24, and a logic circuit output unit 26. The logic circuit reading unit 18 reads a designed logic circuit (designed circuit) which is described in an HDL in a netlist style and stores it in the logic circuit storage unit 20. The logic circuit reading unit 18 also reads all the HDL of a library 16 which is described in an RTL style and corresponds to instances in the HDL description of the logic circuit 14. In the library 16, lower-level modules corresponding to the instances described as components in modules in the logic circuit 14 which is described in the netlist style HDL are registered as modules which are described in an RTL style HDL. If they are described in a netlist style HDL as the library 16, as is elucidated in below description, the netlist style HDL of the library is converted into the RTL style HDL, and the library is read by the logic circuit reading unit 18 of the present embodiment. The library hierarchical expansion unit 22 executes a process of expanding a hierarchy by using the HDL lower-level modules of the library 16 described in the RTL style with respect to each of the instances in the netlist style HDL logic circuit read into the logic circuit storage unit 20, and the logic circuit 14 is converted into the RTL style by this hierarchical expansion process. The assignment statement eliminating unit 24 executes elimination processes of assignment statements in which the assignment statements are replaced and eliminated, with respect to the HDL of the logic circuit converted into the RTL style by the library hierarchical expansion. The logic circuit output unit 26 outputs a logic circuit 28 which has undergone the library hierarchical expansion and the assignment statement elimination process and has been converted into the RTL style HDL. By use of the logic circuit 28 consisting of the converted RTL style HDL, a simulation of an event-driven method is performed by a logic simulator.

Figure 2:
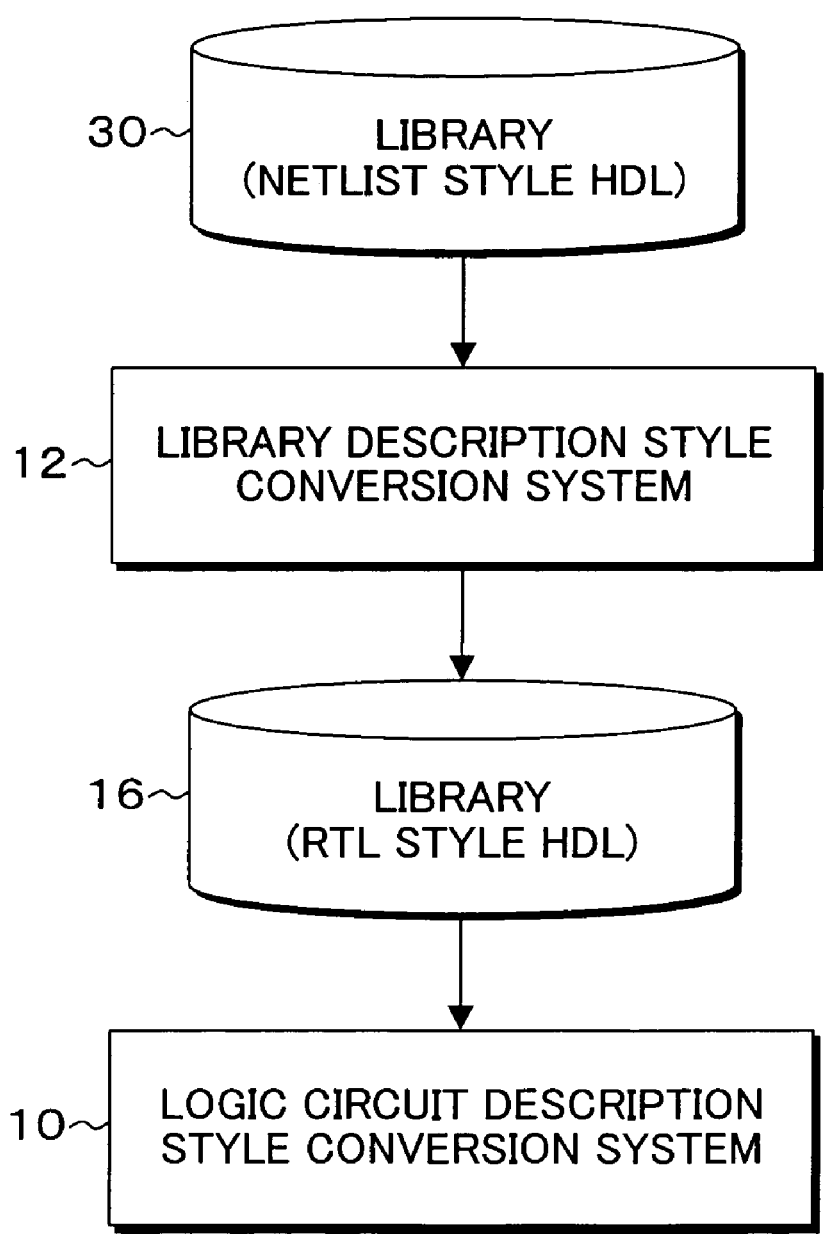
FIG. 2 is a block diagram of the present embodiment combined with a library description style conversion system.

FIG. 2 is a block diagram of the present embodiment which is combined with a library description style conversion system. In FIG. 2, the logic circuit description style conversion system 10 is same as the embodiment of FIG. 1. The present embodiment is the case in which an original library 30 is described in the netlist style HDL. The library is converted into the RTL style HDL by the library description style conversion system 12 and stored in the library 16, and then a conversion process of the logic circuit consisting of the designed netlist style HDL is performed by the logic circuit description style conversion system 10.

Figure 3:
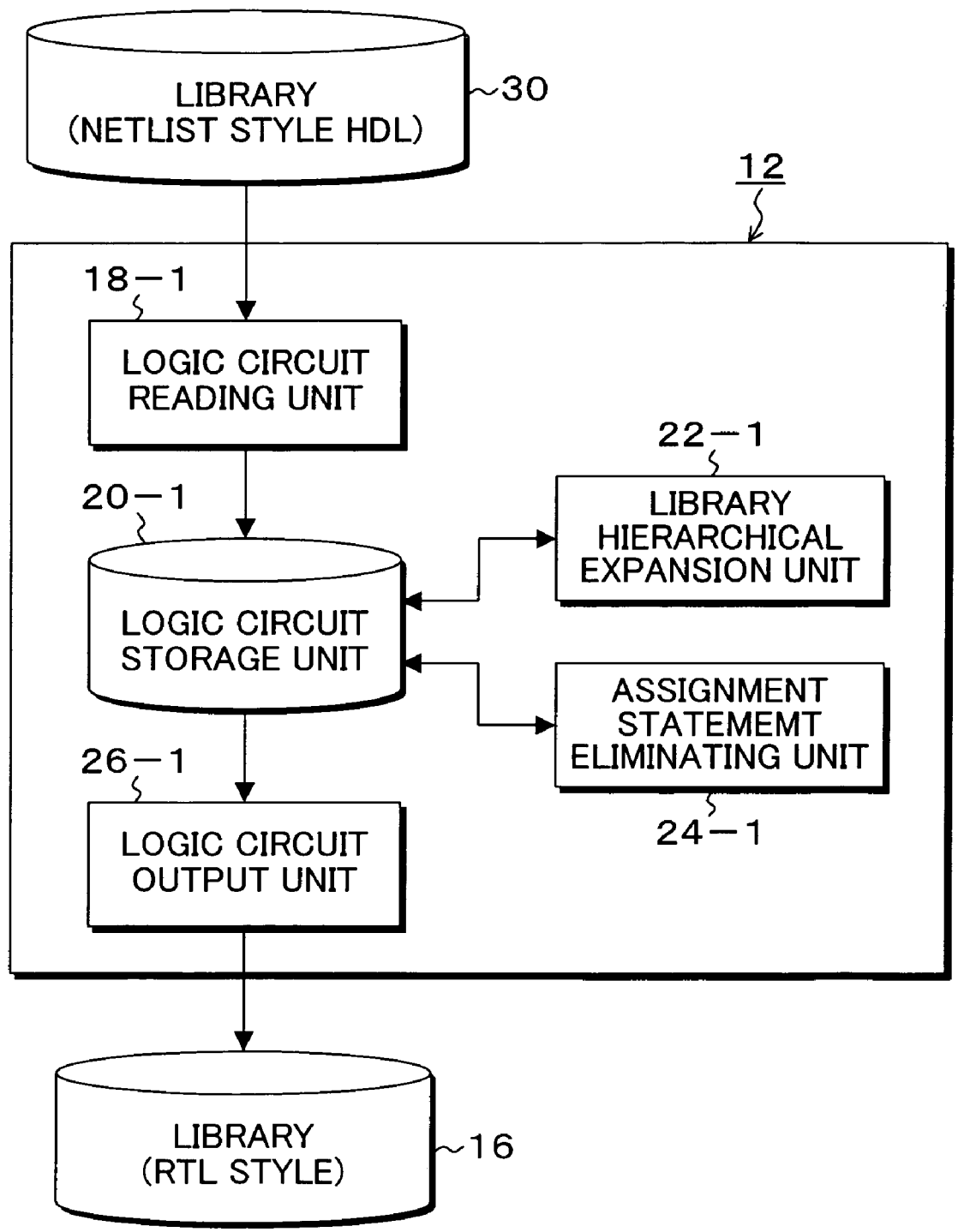
FIG. 3 is a block diagram of a functional configuration showing an embodiment of the library description style conversion system.

FIG. 3 is a block diagram of a functional configuration showing the embodiment of the library description style conversion system 12 of FIG. 2. The library description style conversion system 12 is composed of a logic circuit reading unit 18-1, a logic circuit storage unit 20-1, a library hierarchical expansion unit 22-1, an assignment statement eliminating unit 24-1, and a logic circuit output unit 26-1; and this configuration is basically same as the logic circuit description style conversion system 10 shown in FIG. 1. They are different in the points that the modules corresponding to the instances which are registered as components are read as a conversion-object logic circuit from the library 30 storing the HDL described in the netlist style, and the RTL style HDLs of the basic logic elements corresponding to the instances included in the logic circuit of the conversion object are read and expanded.

Figure 4:
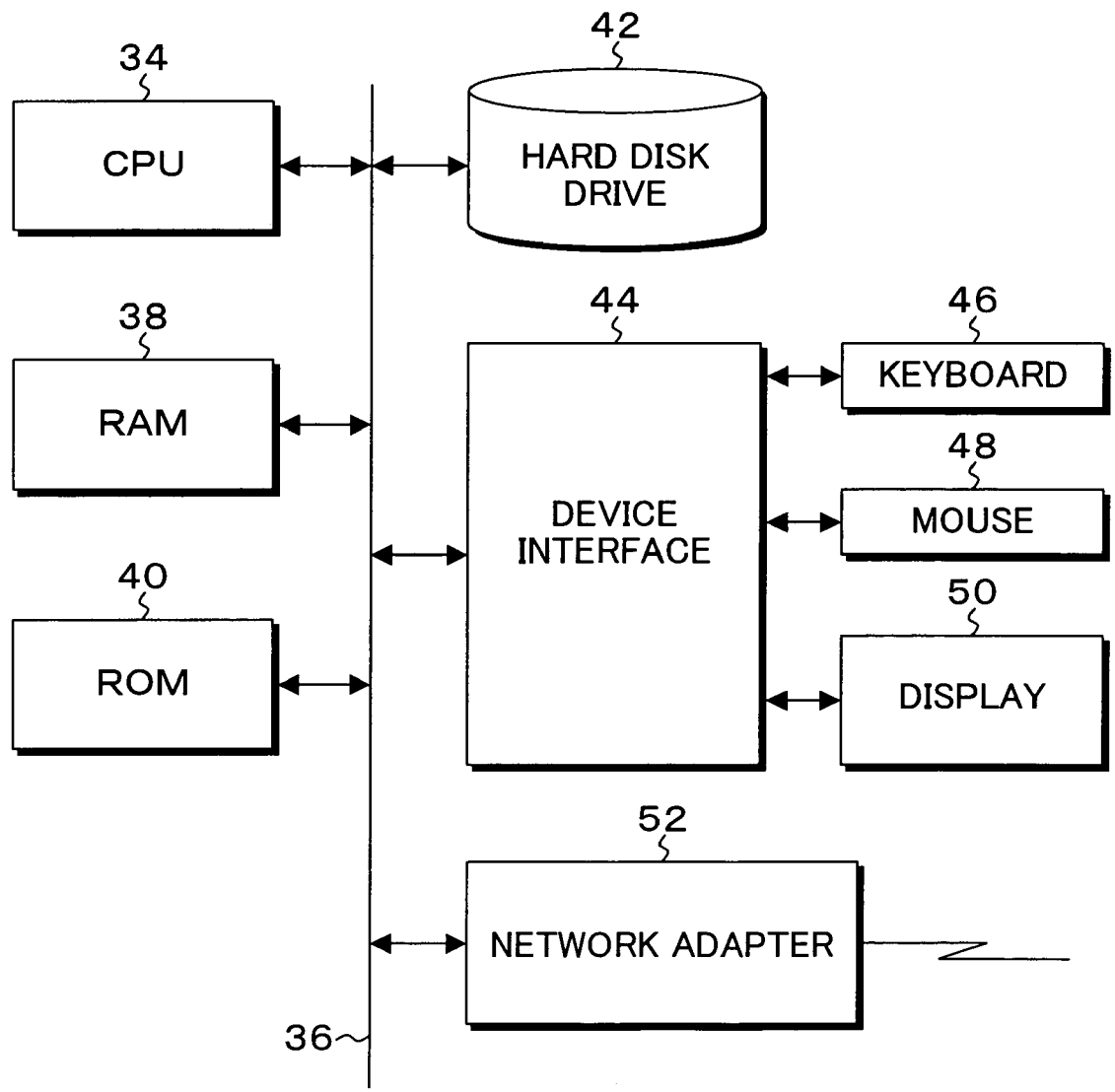
FIG. 4 is a block diagram of a hardware environment of a computer which executes programs which realize functions of the present embodiment.

FIG. 4 is a block diagram of a hardware environment of a computer which executes a program which realizes the functions of the present embodiment. In FIG. 4, to a bus 36 of a CPU 34, a RAM 38, a ROM 40, a hard disk drive 42, a device interface 44 connecting a keyboard 46, a mouse 48, and a display 50, and a network adapter 52 are connected. A program of the present embodiment for converting the description style of the logic circuit and the library is stored in the hard disk drive 42. When the computer is started up, subsequent to deployment of an OS to the RAM 38 after boot-up, the description style conversion program is read from the hard disk drive 42, deployed to the RAM 38, and executed by the CPU 34.

FIG. 5 is an explanatory diagram of the logic circuit 14 which serves as a conversion object in the present embodiment and described in the netlist style HDL. In this logic circuit 14, the module name of a 1st line is "DESIGN", port names are "d, s, c, r, q", port declarations are described in 2nd to 6th lines, wire declarations are described in 7th and 8th lines, and the instances are described in 9th and 10th lines. Herein, the instance in the 9th line is a multiplexer MUX, wherein a logic circuit MUX which is a lower-level module registered in the library 30 is described as a component and made into an instance. The instance of the 10th line is a D-FF with reset, wherein a logic circuit D-FF which is a lower-level module registered in the library 16 is similarly described as a component and made into an instance.

FIGS. 6A and 6B are explanatory diagrams of the library 30 which is registered to correspond to the instances of the 9th line and 10th line of the logic circuit 14 of FIG. 5, and the library 30 is described in the netlist style HDL. The library 30 in the netlist style cannot be used without modification in the description style conversion of the logic circuit in the present embodiment, but is converted into the library 16 described in the RTL style HDL shown in FIG. 7 by the library description style conversion system 12 and used as shown in the embodiment of FIG. 2 and FIG. 3. In the library 30 of FIGS. 6A and 6B which is described in the netlist style, the lower-level module corresponding to the multiplexer MUX of the 9th line of the logic circuit 14 of FIG. 5 is described in 1st to 13th lines. The module MUX in the 1st to 13th lines includes instances of NOT i1, AND i2, AND i3, and OR i4 as instances in the 9th to 12th lines, and modules corresponding to the four instances are correspondingly described in 15th to 32nd lines. HDL is described in 34th to 47th lines as the lower-level module corresponding to the instance DFF of the 10th line of FIG. 5. When the library 30 of FIGS. 6A and 6B described in the netlist style HDL is subjected to hierarchical expansion and redundant assignment statements are replaced and eliminated according to the present embodiment, the RTL style library 16 shown in FIG. 7 can be generated. In the library 16, 1st to 7th lines are the converted part of the instance MUX, and 8th to 21st lines are the converted part of the instance DFF.

FIG. 8 is an explanatory diagram of the RTL style logic circuit 28 which is obtained in the description style conversion process of the present embodiment, in which redundant assignment statements are replaced and eliminated with respect to the logic circuit 14 of the netlist style of FIG. 5, after library hierarchical expansion is performed by using the RTL style library 16 of FIG. 7. In the logic circuit 28 converted into the RTL style, as is clear from comparison with FIG. 5, the instances which use the lower-level modules as components registered in the library are not present, and all the instances are converted into behavioral description sentences. When such RTL style logic circuit 28 is to be input to a logic simulator to perform a simulation in the event-driven method, the simulation can be executed at a high speed since the number of events is significantly reduced.

Figure 9:
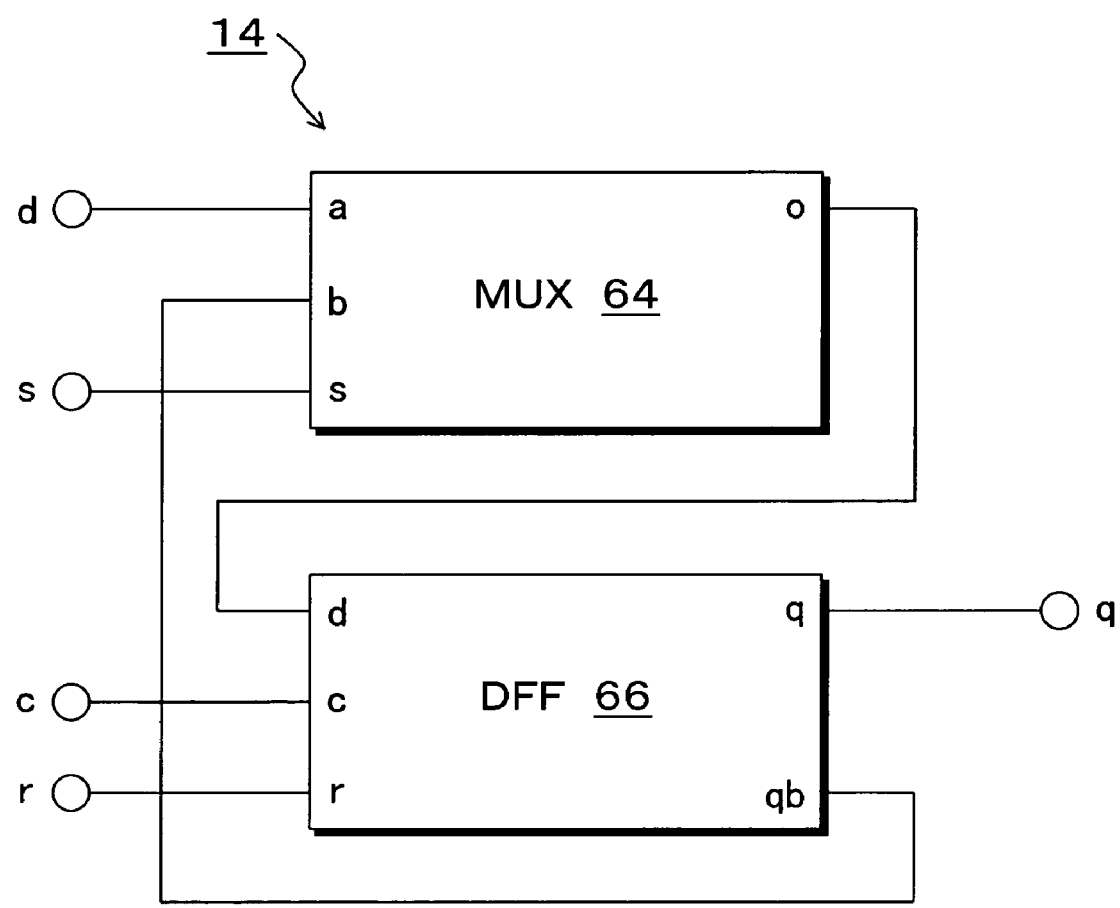
FIG. 9 is a circuit diagram of a logic circuit drawn according to HDL of FIG. 5.

FIG. 9 is a circuit diagram of the logic circuit 14 described according to the HDL of FIG. 5, wherein a multiplexer (MUX) 64 has input pins a, b, and s and an output pin o, and a D-FF with reset (DFF) 66 has input pins d, c, and r and output pins q and qb. In addition, input ports d, s, c, and r are provided as ports of the logic circuit 14, and an output port is a port q.

Figure 10:
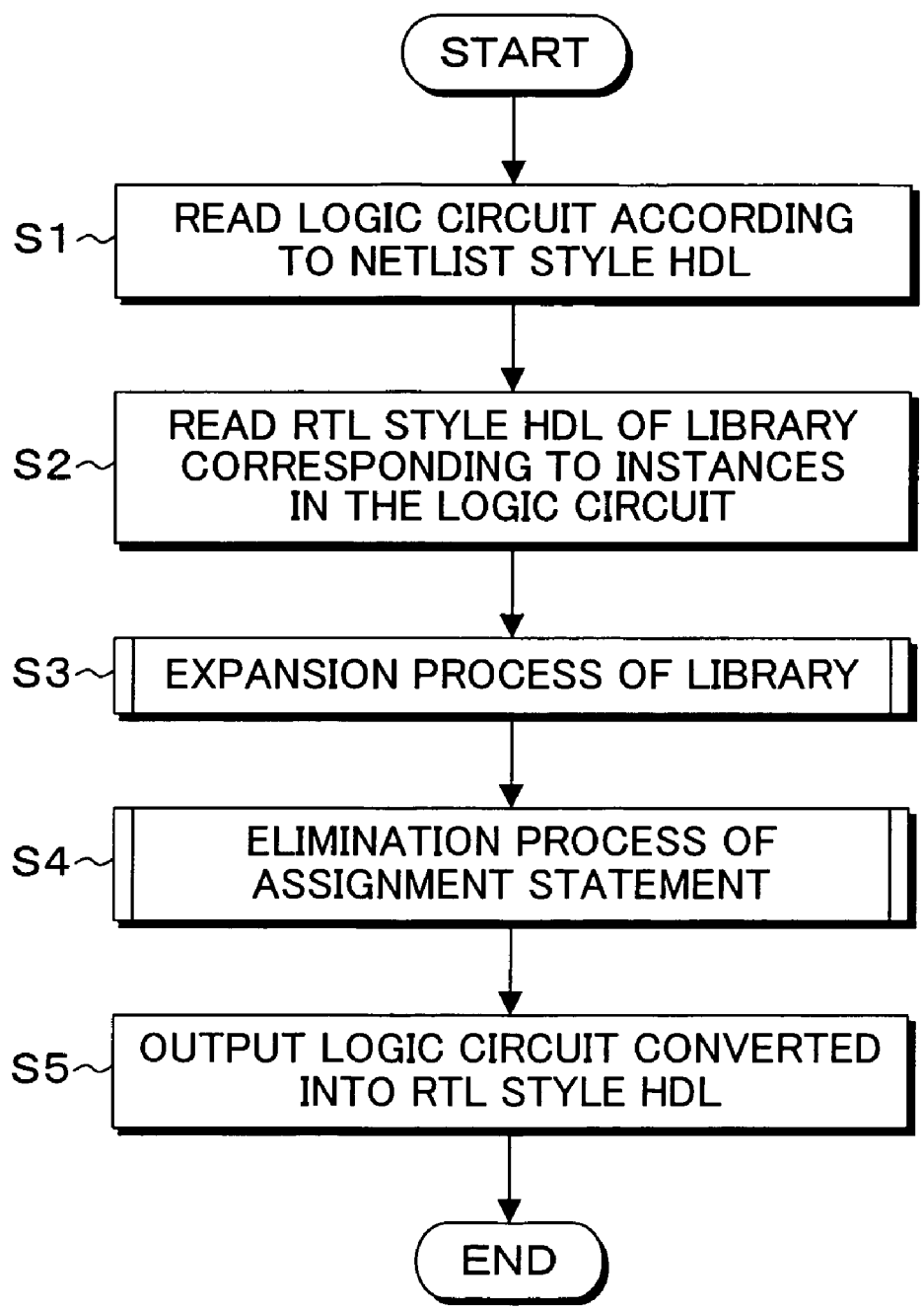
FIG. 10 is a flow chart of a logic circuit description style conversion process according to the embodiment of FIG. 1.

FIG. 10 is a flow chart of the logic circuit style conversion process according to the embodiment of FIG. 1, and it will be described below with reference to FIG. 1. First of all, in step S1, the logic circuit reading unit 18 reads the logic circuit 14 according to the HDL described in the netlist style into the logic circuit storage unit 20. Subsequently, in step S2, the HDL of the library 16 which is corresponding to the instances in the read logic circuit 14 and described in the RTL style is read into the logic circuit storage unit 20. Subsequently, in step S3, the library hierarchical expansion unit 22 performs a process of expanding the hierarchy of the library 16 with respect to each of the instances in the logic circuit 14 stored in the logic circuit storage unit 20, and converts the netlist style of the logic circuit 14 into the RTL style. Subsequently, in step S4, the assignment statement eliminating unit 24 replaces and eliminates the redundant assignment statements stored in the logic circuit storage unit 20. For example, when a replaceable assignment statement is present in the logic circuit, i.e., when the left side of an assignment statement is used in another expression, the part used in the other expression is replaced by the right side of the assignment statement, and the original assignment statement is eliminated. At last, in step S5, the logic circuit output unit 26 outputs the logic circuit 28 converted into the RTL style HDL.

Figure 11:
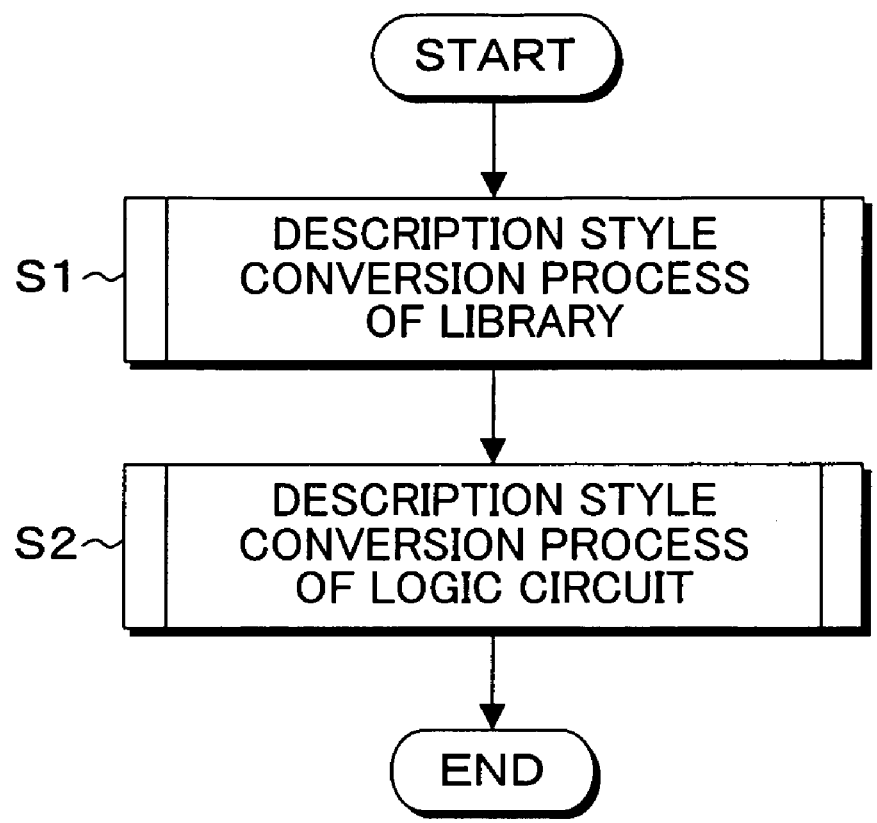
FIG. 11 is a flow chart of a logic circuit description style conversion process including description style conversion of the library of FIG. 2.

FIG. 11 is a flow chart of the logic circuit description style conversion process including the description style conversion of the library shown in FIG. 2. This process is applied when, for example as shown in FIGS. 6A and 6B, the library in which the modules corresponding to the instances of the netlist style logic circuit of a conversion processing object are registered is described in the netlist style HDL. Specifically, after the description style of the library is converted from the netlist style to the RTL style in step S1, the logic circuit is converted from the netlist style to the RTL style in step S2.

Figure 12:
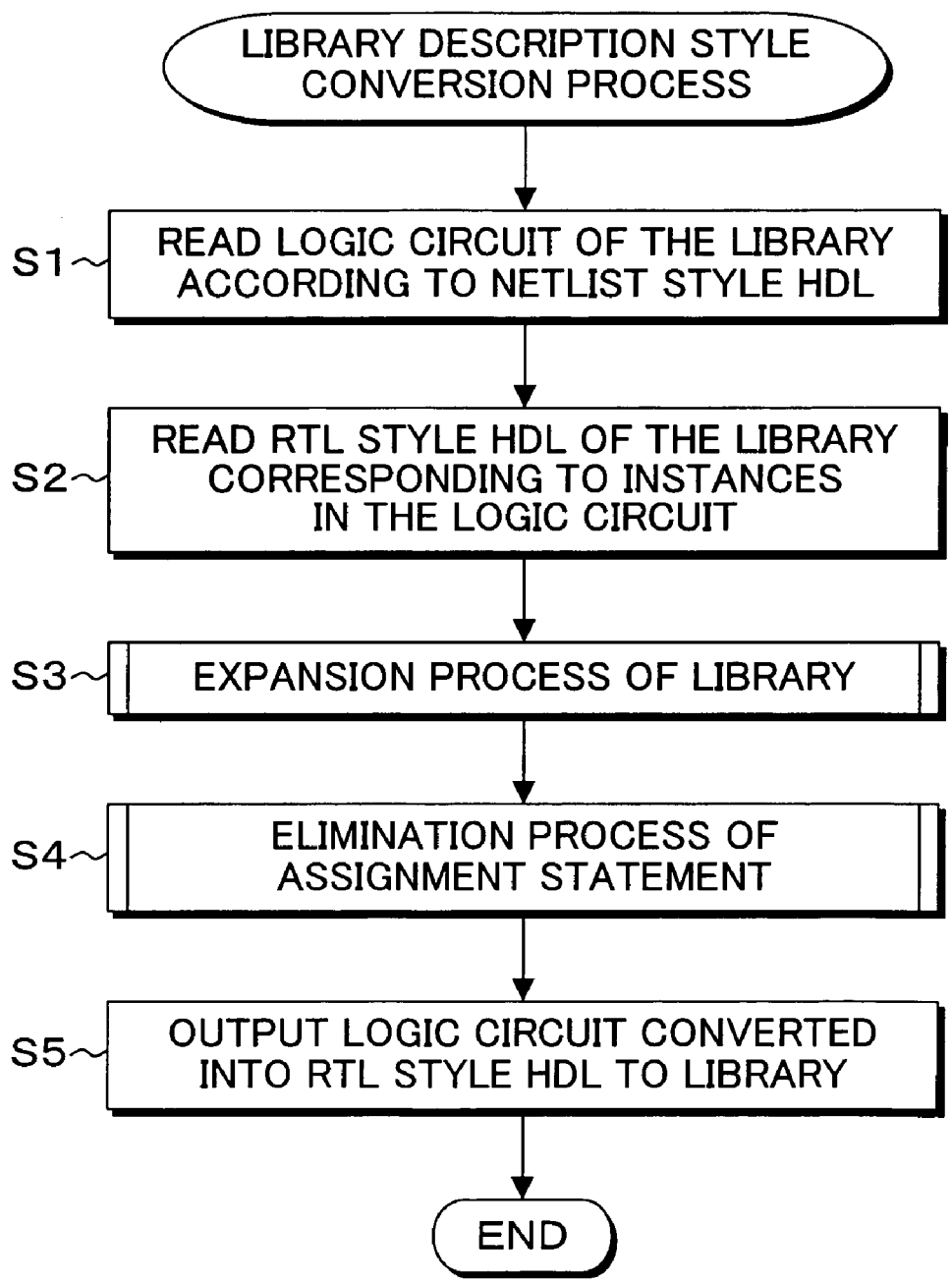
FIG. 12 is a flow chart showing details of the library description style conversion process of FIG. 11.

FIG. 12 is a flow chart showing details of the description conversion process of the library in step S1 of FIG. 11. This library description conversion process is performed by the library description style conversion system 12 shown in the embodiment of FIG. 3, and steps S1 to S5 of the processing procedures are basically same as the conversion process shown in FIG. 10 with respect to the logic circuit.

Figure 13A:
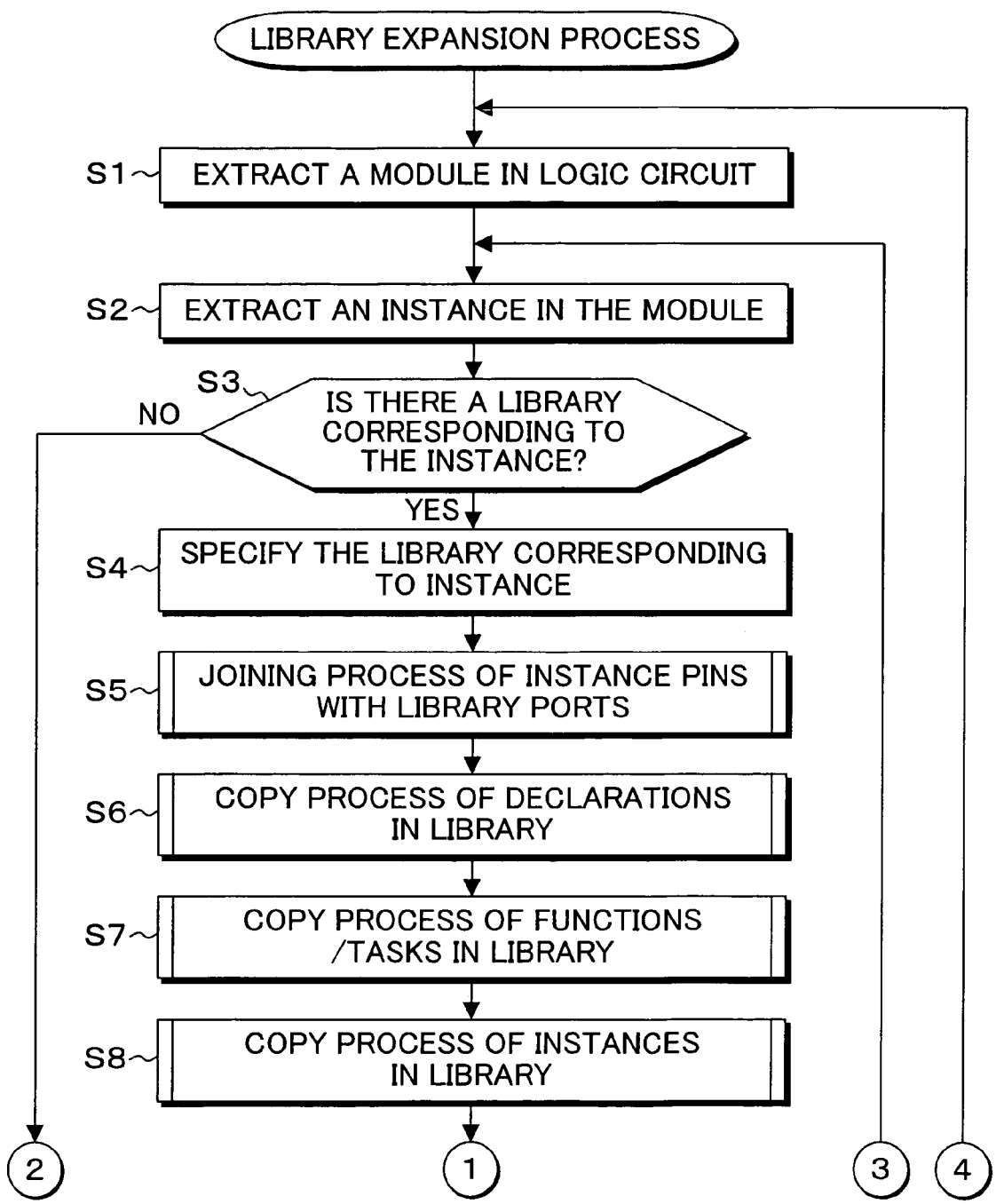
FIGS. 13A and 13B are flow charts showing the library expansion process of step S3 of FIG. 10.
Figure 13B:
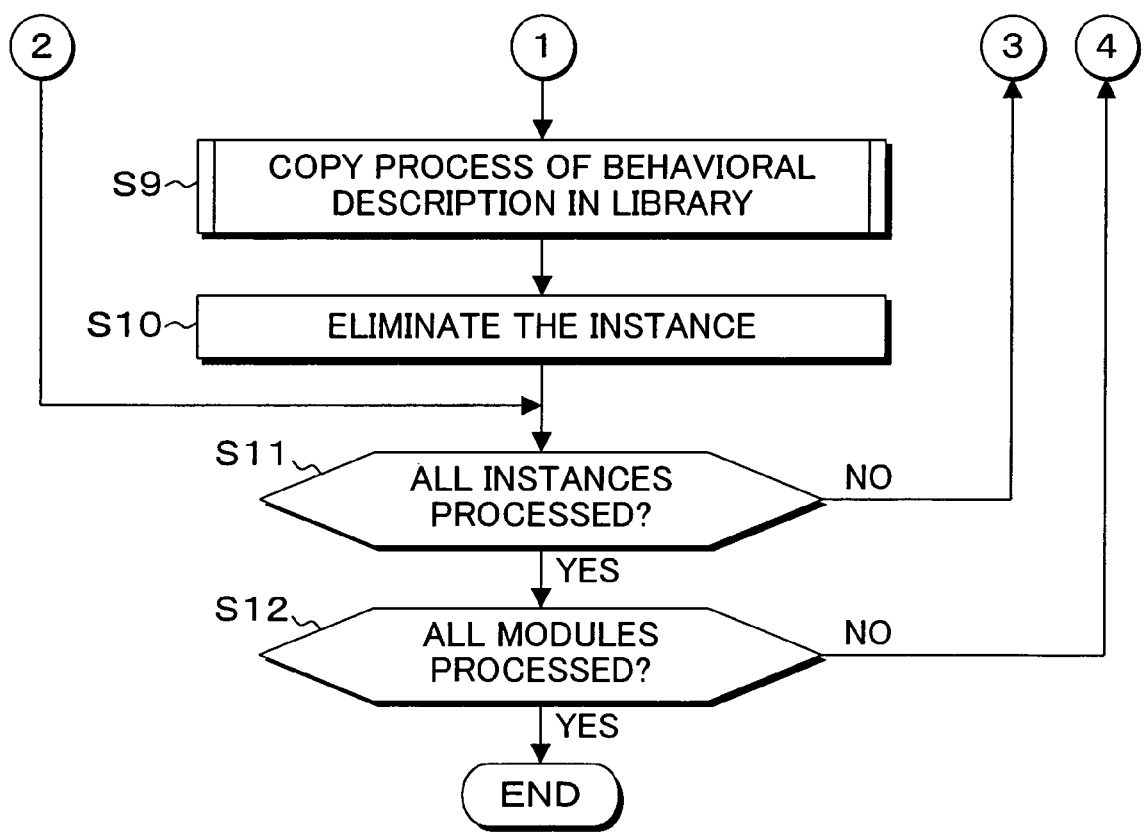

FIGS. 13A and 13B are flow charts showing the library expansion process in step S3 of FIG. 10. In FIGS. 13A and 13B, in the library expansion process, a module in the logic circuit is extracted in step S1, and an instance in the module is extracted in step S2. Then, in step S3, whether there is a library corresponding to the instance or not is checked. If there is a corresponding library, the library is expanded in the processes of steps S4 to S10, and the instance is converted from the netlist style to the RTL style. If there is no library corresponding to the instance in step S3, the processes of steps S4 to S10 are skipped. When the library corresponding to the instance is present, the library corresponding to the instance is specified in step S4. Next, in step S5, a process of joining instance pins with library ports is executed. Next, in step S6, a copy process of declarations in the library is performed. Subsequently, in step S7, a copy process of functions and/or tasks in the library is performed. Subsequently, in step S8, a copy process of instances in the library is performed. Furthermore, in step S9, a copy process of behavioral descriptions in the library is performed. Consequently, library expansion of the instance is finished, and therefore, the instance of an object is eliminated in step S10. Subsequently, in step S11, whether all the instances in the modules are processed or not is checked. If they are unprocessed, the process returns to step S2, wherein a next instance is extracted from the module, and the processes from step S3 are repeated. If the all the instances in the module are processed in step S11, the process proceeds to step S12, in which whether all the modules in the logic circuit are processed or not is checked. If they are unprocessed, the process returns to step S1, in which a next module is extracted from the logic circuit, and the processes from step S2 are repeated. If all the modules are processed in step S12, the series of library expansion process is terminated, and the process returns to the main routine of FIG. 10.

Figure 14:
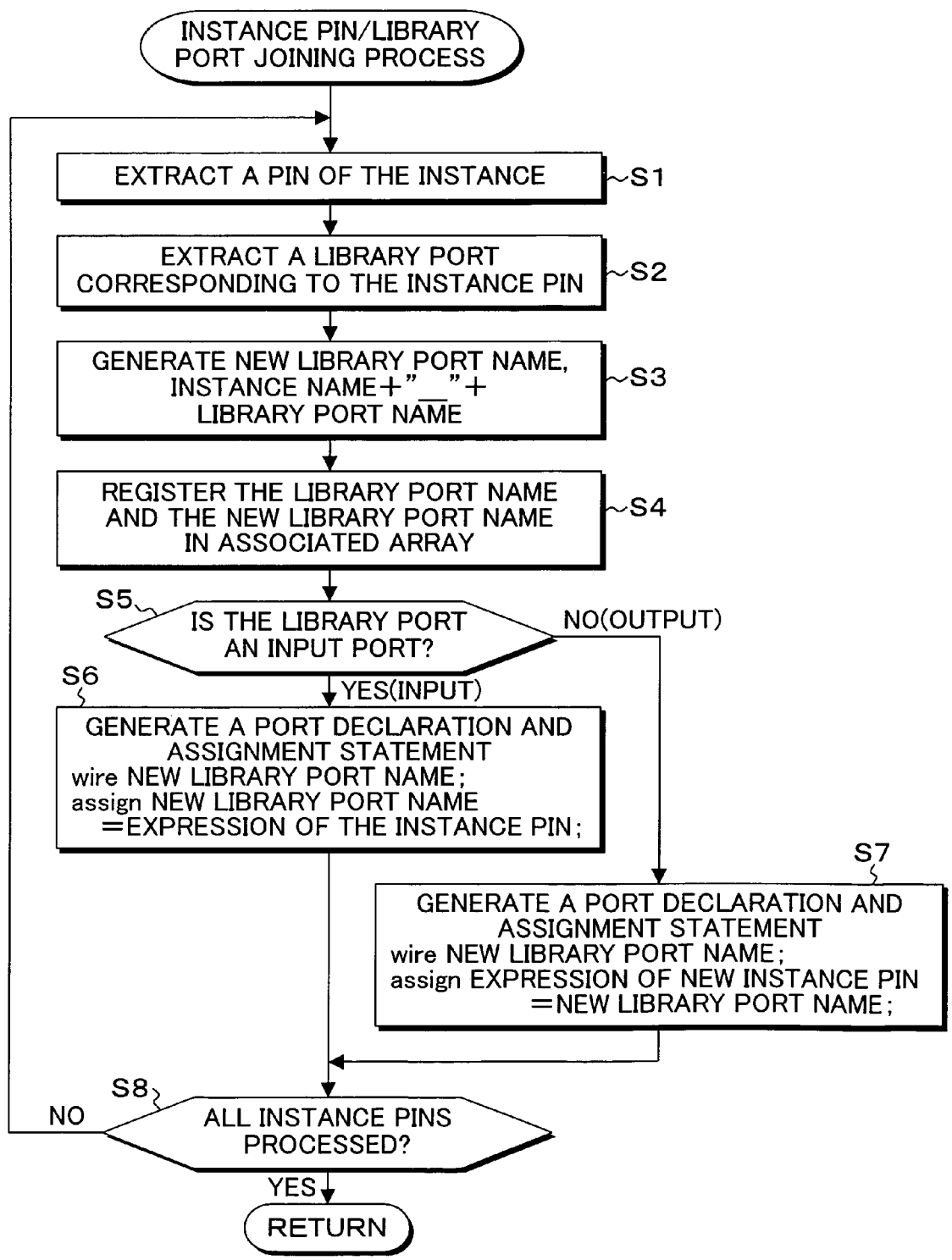
FIG. 14 is a flow chart showing details of the joining process of the instance pins with the library ports in step S5 of FIGS. 13A and 13B.

FIG. 14 is a flow chart showing details of the joining process of the instance pins and the library ports in step S5 of FIGS. 13A and 13B. In FIG. 14, one instance pin is extracted in step S1, and a library port corresponding to the instance pin is then extracted in step S2. Subsequently, in step S3, a new library port name is generated. The new library port name is (new library port name)=(instance name+"_"+library port name). Note that "_" is referred to as underscore. Subsequently, in step S4, the original library port name and the generated new library port name are registered in an associative array. Next, in step S5, whether the library port is an input port or not is checked. If it is an input port, the process proceeds to step S6, and a port declaration and an assignment statement corresponding to the input port are generated. The port declaration and the assignment statement are
wire new library port name;
assign new library port name=expression of instance pin. On the other hand, in step S5, if the library port is not an input port, in other words, if it is an output port, the process proceeds to step S7, and a port declaration and an assignment statement corresponding to the output port are generated. The port declaration and the assignment statement are
wire new library port name;
assign expression of instance pin=new library port name. Next, whether all the instance pins are processed or not is checked in step S8. If they are unprocessed, the process returns to step S1, in which a next instance pin is extracted, and the processes from step S2 are repeated. When all the instance pins are processed, the series of processes are terminated, and the process returns to the library expansion process of FIGS. 13A and 13B.

FIGS. 15A to 15C show a specific example of the joining process of an instance pin and a library port. FIG. 15A is the logic circuit 14 describing an instance of a processing object. FIG. 15B is the library 16 corresponding to the instance of the logic circuit 14. When the joining process of an instance pin and a library port of FIG. 14 is applied to the instance of FIG. 15A, they will be as shown in a hierarchical expansion work 60-1 of FIG. 15C. More specifically, an instance pin a of FIG. 15A is extracted in step S1 of FIG. 14, a 2nd line of the library port 16 of FIG. 15B corresponding to the instance pin a is extracted in step S2, (new library port name)=(instance name)+"_"+(library port name)=i1_a is generated as a new library port name in step S3, and it is registered in the associative array together with the library port name a in step S4. Subsequently, since the library port a is an input port in step S5, a port declaration and an assignment statement are generated in step S6 as shown in the 1st and 2nd lines of FIG. 15C. A new library port name "i1_o" is generated for a pin o of a next instance pin, and, since the library port is an output port, a port declaration and an assignment statement for an output port are generated as shown in the 3rd and 4th lines of FIG. 15C.

FIGS. 16A to 16C show a specific example of the joining process of an instance pin and a library port in the case in which the library port is declared as a register. FIG. 16A is the logic circuit 14 describing an instance of a processing object. FIG. 16B is the library 16 corresponding to the instance of the logic circuit 14. When the joining process of the instance pin and the library port of FIG. 14 is applied to the instance of FIG. 16A, they will be as shown in a hierarchical expansion work 60-1A of FIG. 16C. More specifically, the instance pin q of FIG. 16A is extracted in step S1 of FIG. 14, the 3rd line of the library port 16 of FIG. 16B corresponding to the instance pin q is extracted in step S2, "i2_q" is generated as a new library port name in step S3, and, since the library port is an output port, the port declaration and the assignment statement of FIG. 16C for the output port are generated.

Figure 17:
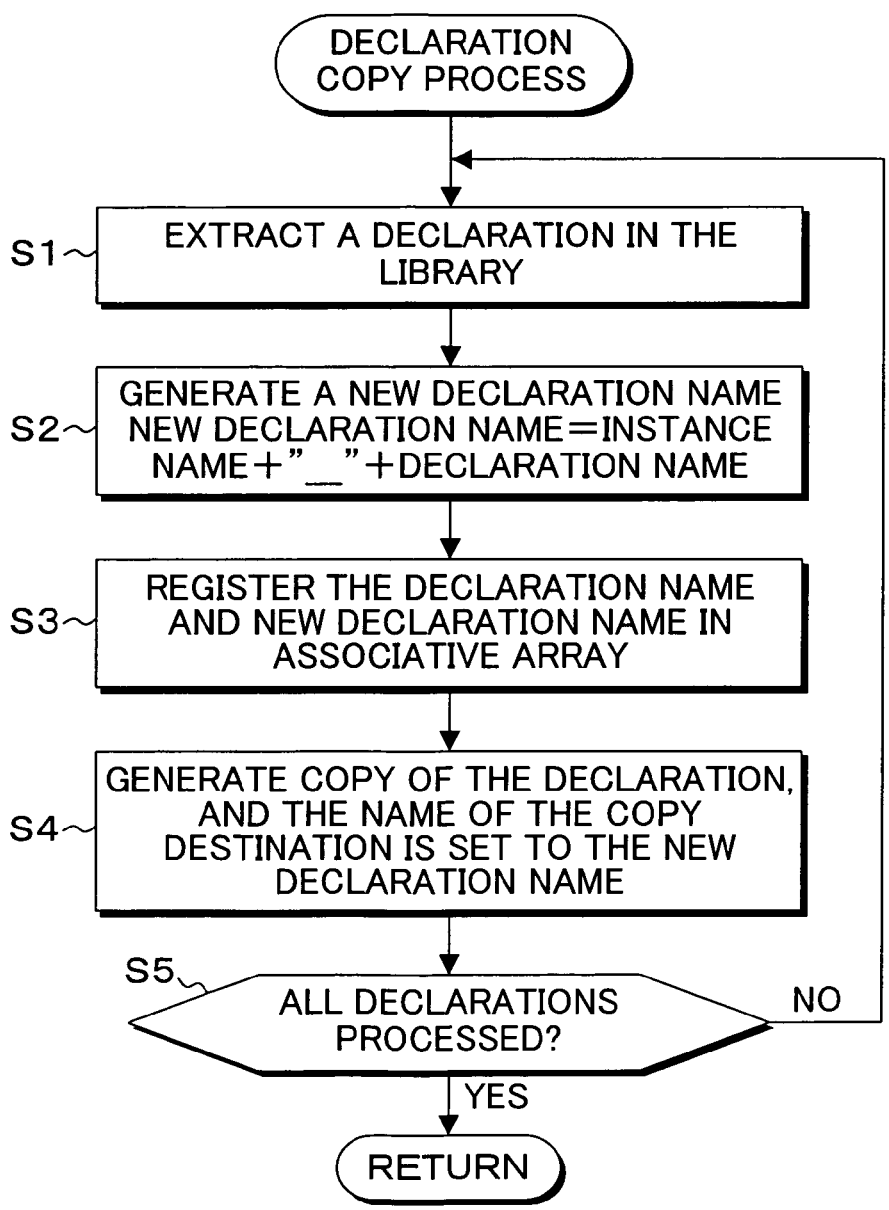
FIG. 17 is a flow chart showing details of the declaration copy process in step S6 of FIGS. 13A and 13B.

FIG. 17 is a flow chart showing details of the declaration copy process in step S6 of FIGS. 13A and 13B. In this declaration copy process, with respect to declarations in a library, copy of the declaration is generated. In this case, among data type declarations such as wire, declarations of input/output are excluded from the processing objects. A new declaration name of a copy destination is (new declaration name)=(instance name)+"_"+(declaration name). More specifically, in the declaration copy process of FIG. 17, a declaration in the library is extracted in step S1, a new declaration name is generated in step S2, and the declaration name and a new declaration name are registered in the associative array in step S3. Subsequently, in step S4, a copy of the declaration is generated, and the name of the copy destination is set as a new declaration name. The processes of steps S1 to S4 are repeated until all declarations are processed in step S5.

Figure 18A:
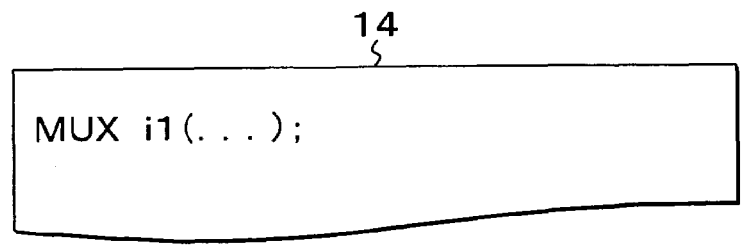
FIGS. 18A to 18C are explanatory diagrams showing a specific example of the declaration copy process.
Figure 18B:
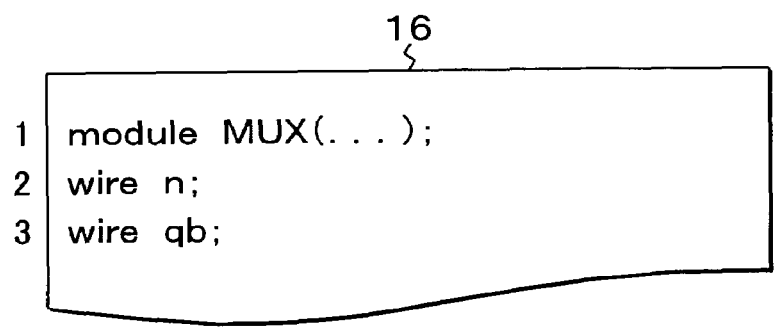
Figure 18C:
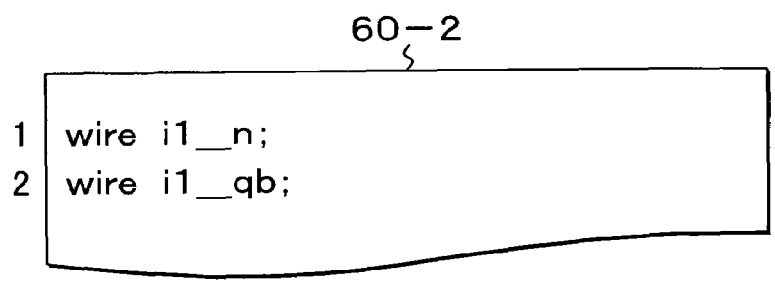

FIGS. 18A to 18C show a specific example of the declaration copy process. When a library corresponding to the instance of the logic circuit 14 shown in FIG. 18A is the library 16 of FIG. 18B, a declaration copy shown in a hierarchical expansion work 60-2 of FIG. 18C is generated by the declaration copy process of FIG. 17. Herein, a new declaration name of a wire declaration in a 2nd line of the library 16 is "i1_n", and a new declaration name of a wire declaration in a 3rd line of the library 16 is "i1_qb". The declaration copy shown in 1st and 2nd lines of FIG. 18C is generated by using these new declaration names.

Figure 19:
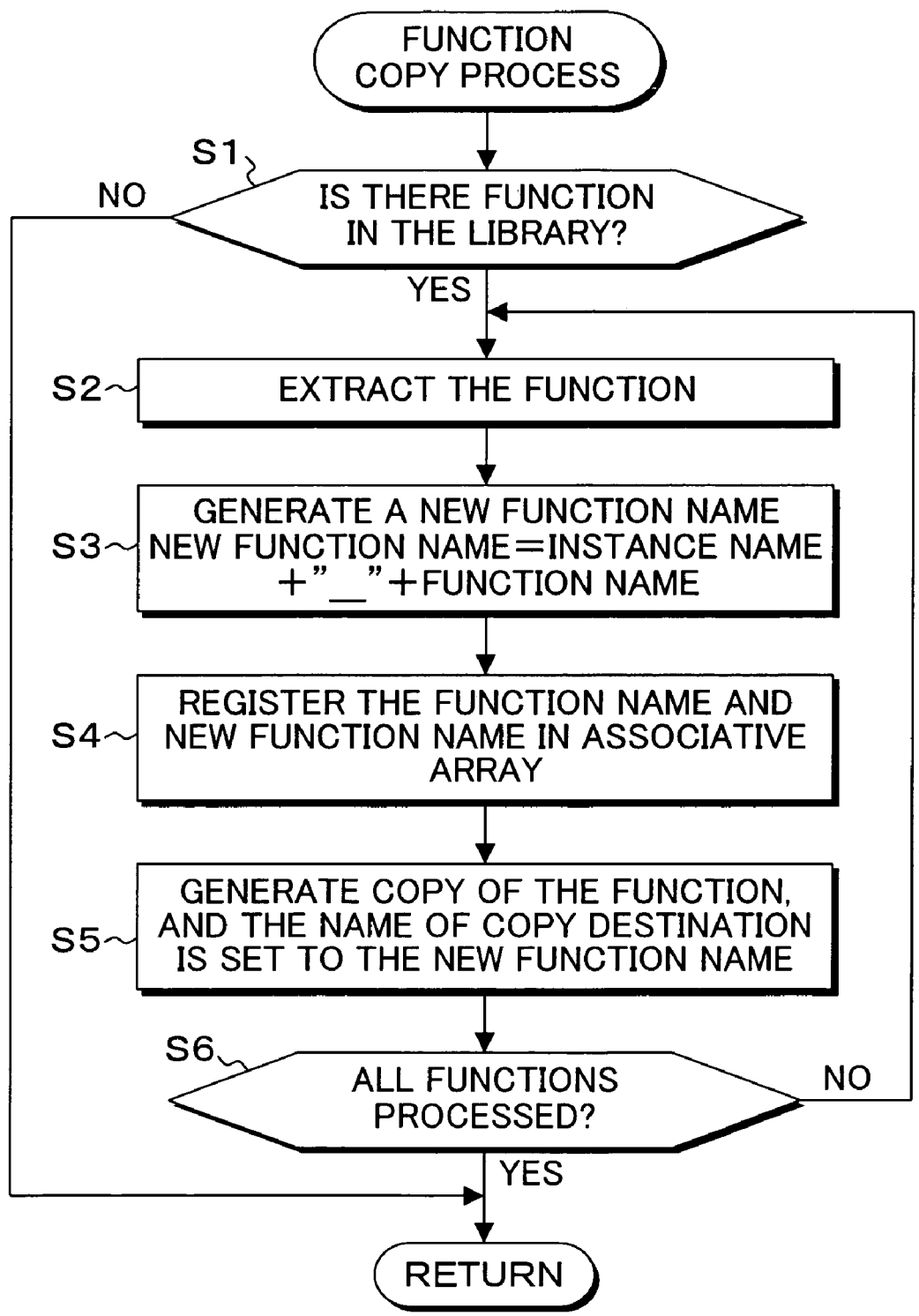
FIG. 19 is a flow chart showing details of the function copy process in step S7 of FIGS. 13A and 13B.

FIG. 19 is a flow chart showing details of the function copy process in step S7 of FIGS. 13A and 13B. In the function copy process, a copy of a function is generated for each function in a library. In this copy of the function, all statement is copied. The new function name of the copy destination is set as (new function name)=(instance name)+"_"+(function name). An argument (input/output) of the function or a declaration in the function is copied without modification. Furthermore, a variable name of a library port or a declaration in a library used in the function is changed to a new variable name after the copy. Furthermore, the return value of the function is set as a new function name. Such function copy process will be described below in relation to the flow chart of FIG. 19. First of all, whether there is a function in the library or not is checked in step S1. If there are functions, one function is extracted in step S2, and a new function name is generated in step S3. Subsequently, in step S4, the function name and the new function name are registered in the associative array. Subsequently, in step S5, a copy of the function is generated, and the name of the copy destination is set as the new function name. Subsequently, in step S6, whether all the functions are processed or not is checked. If they are unprocessed, the process returns to step S2, in which a next function is extracted, and similar processes are repeated. If there is no function in the library in step S1, or if all the functions are processed in step S6, the process returns to the hierarchical process of FIGS. 13A and 13B.

FIGS. 20A to 20C are explanatory diagrams showing a specific example of the function copy process. In FIGS. 20A to 20C, if the library 16 of FIG. 20B corresponding to an instance of the logic circuit of FIG. 20A is present, a function copy of a hierarchical expansion work 62 shown in FIG. 20C is generated by the function copy process of FIG. 19. Herein, a new function name for the function name "s1" in a 2nd line of the library 16 is "i1_s1", and this new function name is used in a 1st line and 3rd line of FIG. 20C. Except for that, 2nd to 5th lines of the library 16 are copied without modification as 1st to 4th lines as shown in the hierarchical expansion work 62 of the function copy process.

Figure 21:
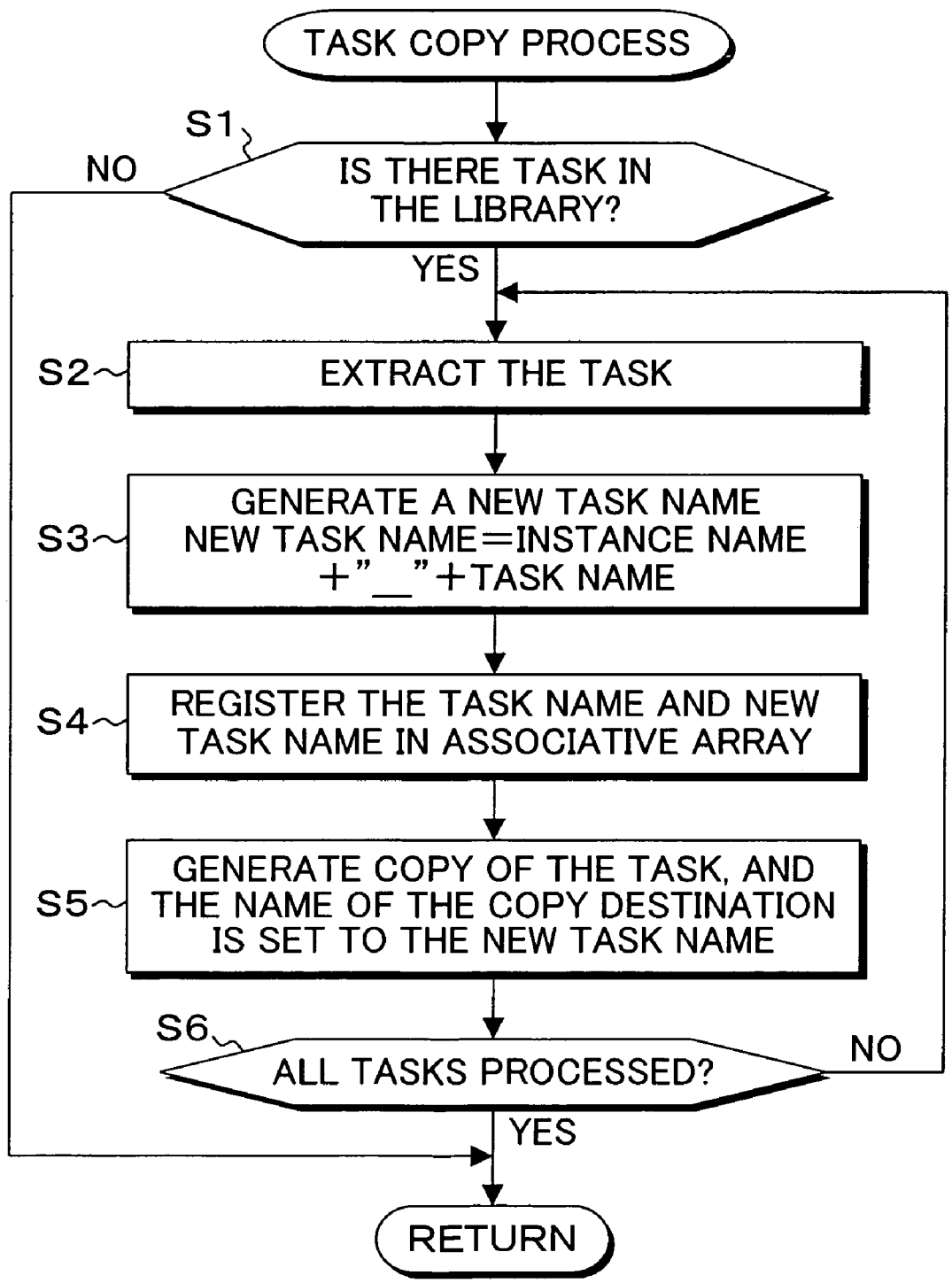
FIG. 21 is a flow chart showing details of the task copy process in step S7 of FIGS. 13A and 13B.

FIG. 21 is a flow chart showing details of the task copy process in step S8 of FIGS. 13A and 13B. The task copy process is also basically same as the function copy process of FIG. 19. More specifically, in the task copy process, a copy of a task is generated for each task in a library. In this copy of the task, all statement is copied. The new task name of the copy destination is set as (new task name)=(instance name)+"_"+(task name) An argument (input/output) of the task or a declaration in the task is copied without modification. In addition, a variable name of a library port or a declaration in a library used in the task is changed to a new variable name after the copy. This task copy process will be described below in relation to FIG. 21. First of all, whether there is a task in the library or not is checked in step S1, one task is extracted in step S2 if there are tasks, a new task name is generated in step S3, and they are registered in the associative array in step S4. Subsequently, in step S5, a copy of the task is generated, and the name of the copy destination is set as the new task name.

Subsequently, in step S6, whether all the tasks are processed or not is checked. If they are unprocessed, the process returns to step S2, in which a next task is extracted, and similar processes are repeated. If all the tasks are processed in step S6 or if there is no task in step S1, the task copy process is terminated, and the process returns to the hierarchical expansion of FIGS. 13A and 13B.

Figure 22:
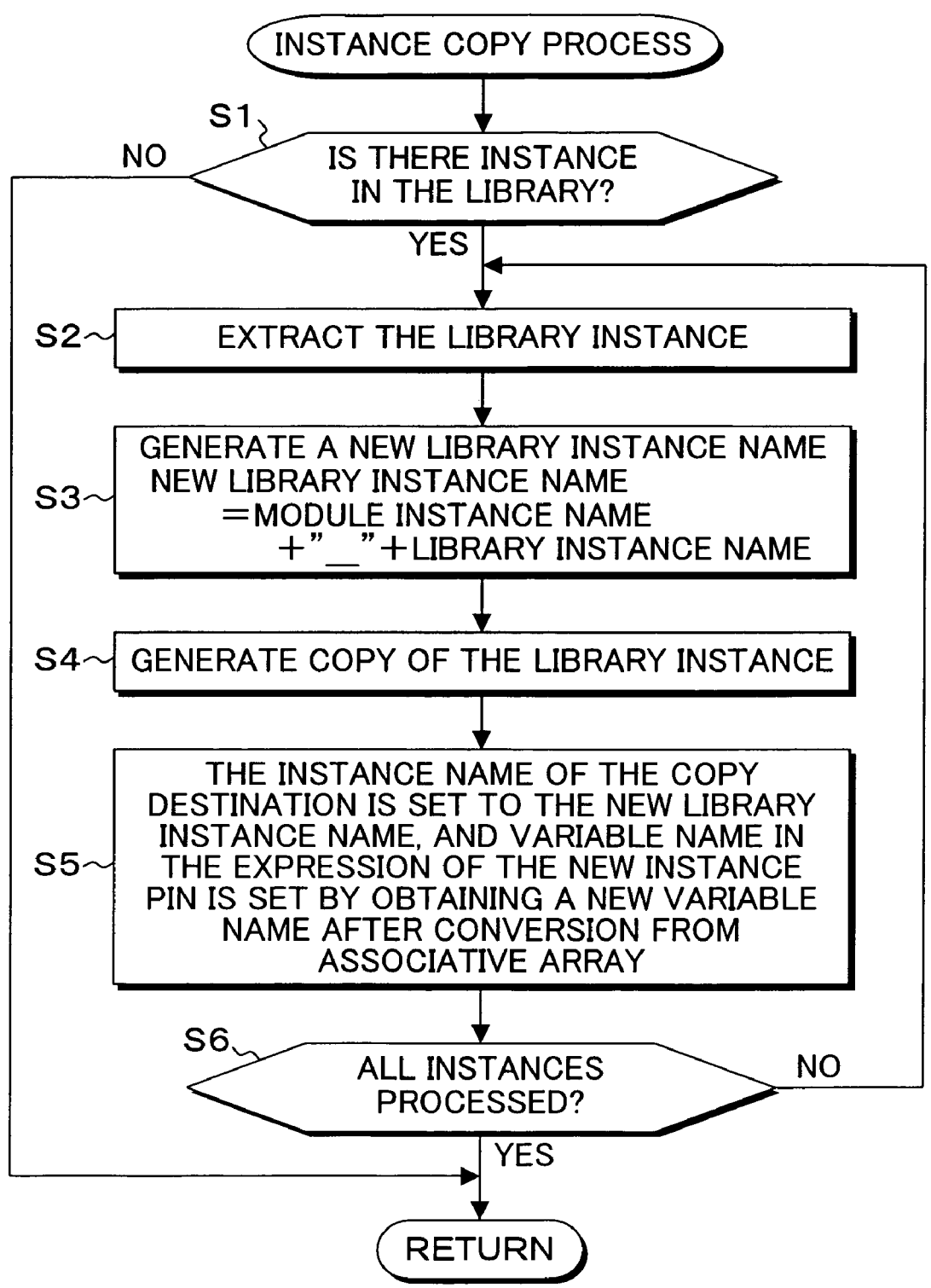
FIG. 22 is a flow chart showing details of the instance copy process in step S8 of FIGS. 13A and 13B.

FIG. 22 is a flow chart showing details of the instance copy process in step S8 of FIGS. 13A and 13B. In the instance copy process, with respect to each instance in a library, a copy of the instance is generated. A new instance name of the copy destination is set as (new instance name)=(module instance name)+"_"+(library instance name). Variables in the expression of the instance pin, i.e., names of library ports, declarations in the library, and functions in the library are changed to new variable names. This instance copy process will be described below in relation to FIG. 22. First of all, whether there are instances in the library or not is checked in step S1, one library instance is extracted in step S2 if there are instances, and a new library instance name is generated in step S3. Subsequently, in step S4, a copy of the library instance is generated. Furthermore, in step S5, the name of the copied new instance is set as the new library instance name, and the variable names in the expression of the copied new instance pin are set by obtaining new variable names after conversion from the associative array. Subsequently, in step S6, whether all the instances are processed or not is checked. If they are unprocessed, the process returns to step S2, in which a next library instance is extracted, and similar processes are repeated. If all the instances are processed in step S6 or if there is no instance in the library in step S1, the process returns to the hierarchical expansion of FIGS. 13A and 13B.

Figure 23A:
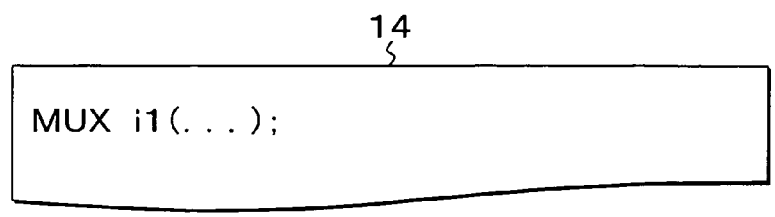
FIGS. 23A to 23C are explanatory diagrams showing a specific example of the instance copy process.
Figure 23B:
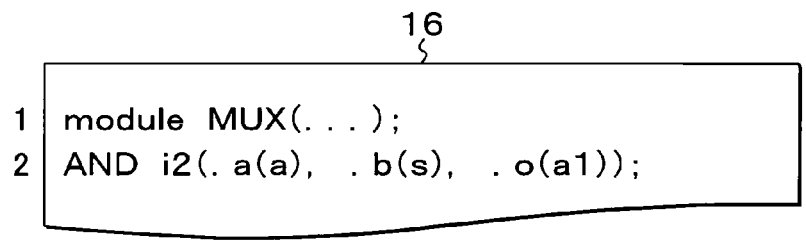
Figure 23C:
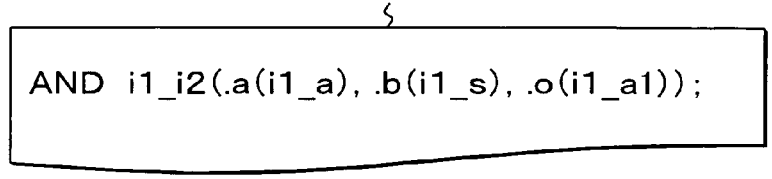

FIGS. 23A to 23C are explanatory diagrams showing a specific example of the instance copy process. In FIGS. 23A to 23C, when the library 16 of FIG. 23B corresponds to an instance of the logic circuit 14 of FIG. 23A, an instance copy shown in a hierarchical expansion work 60-3 of FIGS. 23A to 23C is generated by the instance copy process. Herein, a new instance name of the destination to which the instance in a 2nd line of the library 16 is copied is "i1_i2", and this is set as a new instance name of FIG. 23C. For the variable names shown in parentheses of the instance of the 2nd line of the library 16, corresponding new variable names "i1_a", "i1_s", and "i1_a1" are obtained from the associative array generated in the previous copy processes and set.

Figure 24:
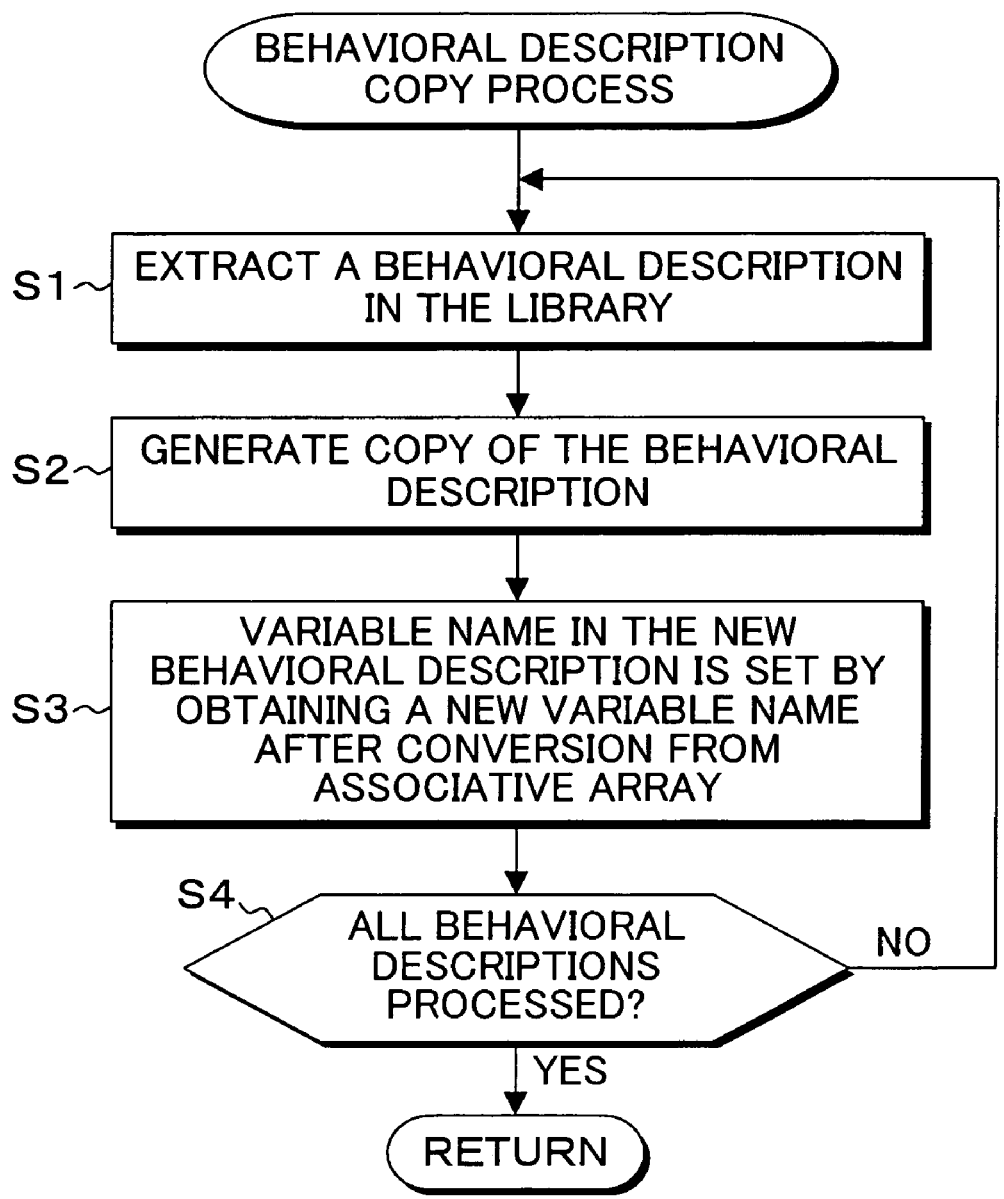
FIG. 24 is a flow chart showing details of the behavioral description copy process in step S9 of FIGS. 13A and 13B.

FIG. 24 is a flow chart showing details of the behavioral description copy process in step S9 of FIGS. 13A and 13B. In the behavioral description copy process, with respect to initial statements, always statements, and assign statements, which are behavioral descriptions in the library, copies of the behavioral descriptions thereof are generated. When copy is to be performed, variables in the statements of behavioral descriptions, i.e., library ports, declarations in the library, and functions in the library are changed by obtaining new variable names after copy from the associative array. This behavioral description copy process will be described below in relation to FIG. 24. A behavioral description in the library is extracted in step S1, and a copy of the behavioral description is generated in step S2. Subsequently, in step S3, variables in the copy of the behavioral description are set by obtaining new variable names from the associative array after conversion. Subsequently, in step S4, whether all behavioral descriptions are processed or not is checked, and the processes from step S1 are repeated until all the behavioral descriptions are processed. When the hierarchical expansion of the library is finished through the above described series of processes, in step S1 of FIGS. 13A and 13B, the instance of which expansion is finished is eliminated.

Figure 25A:
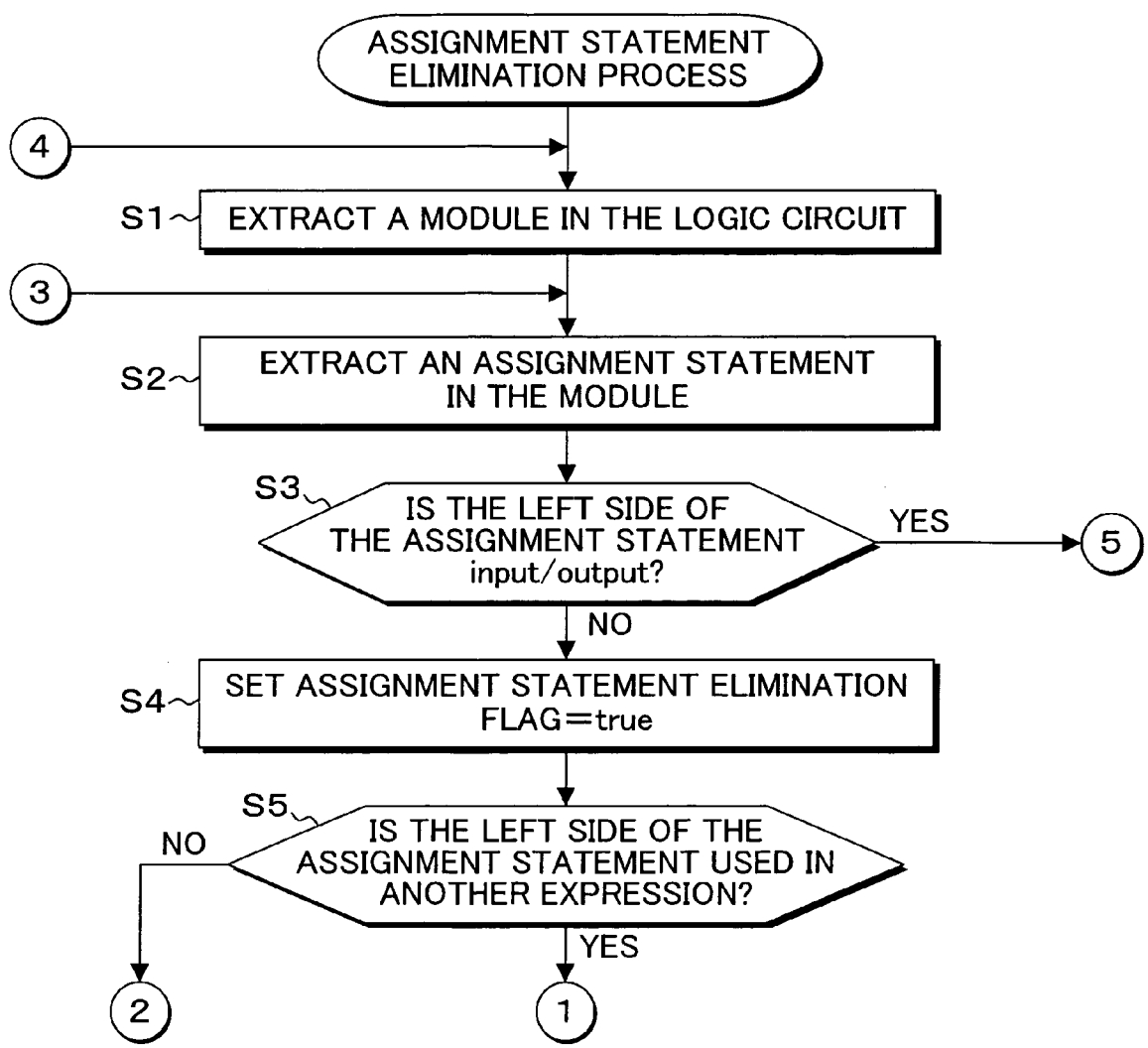
FIGS. 25A and 25B are flow charts showing the assignment statement elimination process of step S4 of FIG. 10.
Figure 25B:
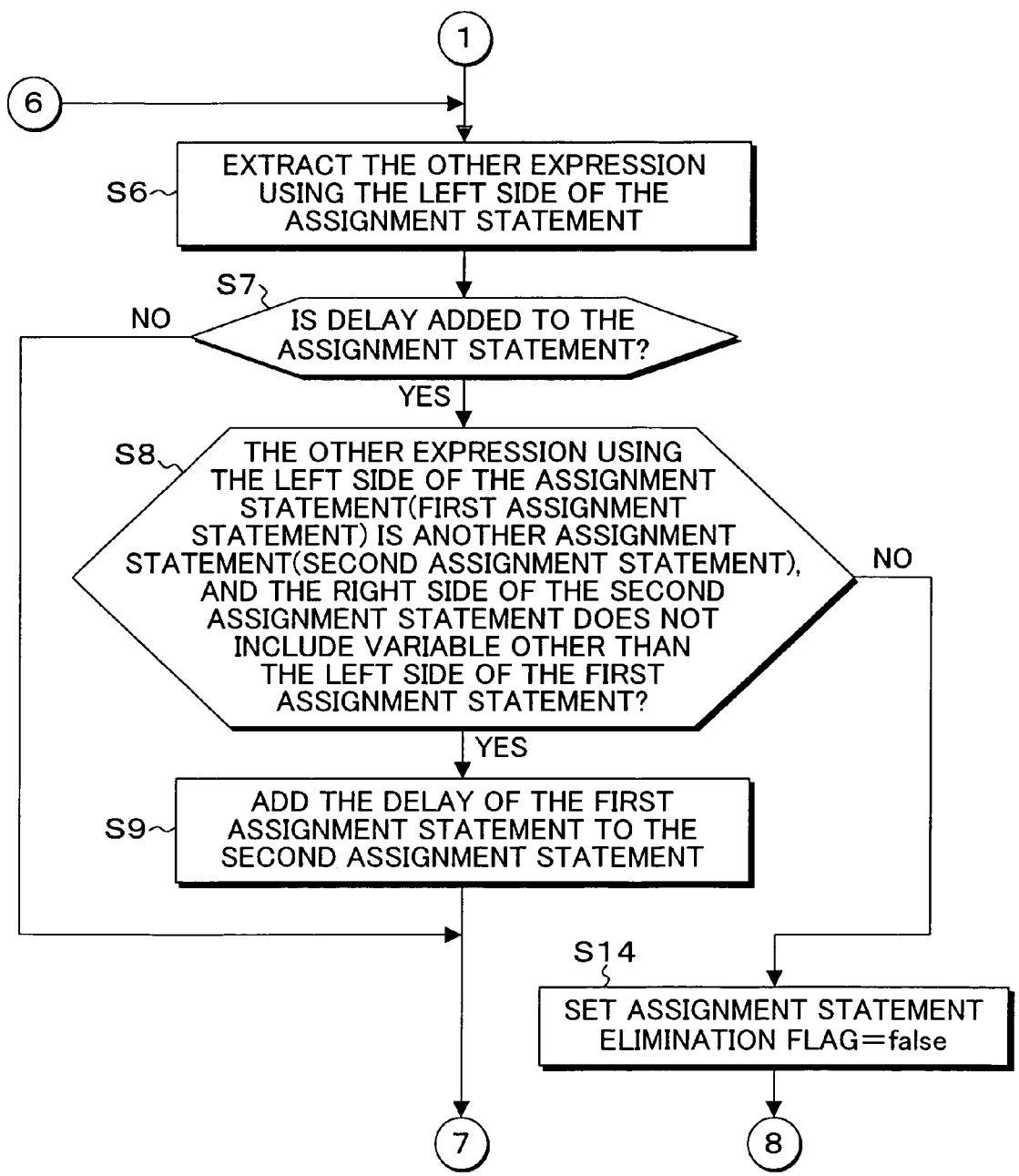
Figure 26:
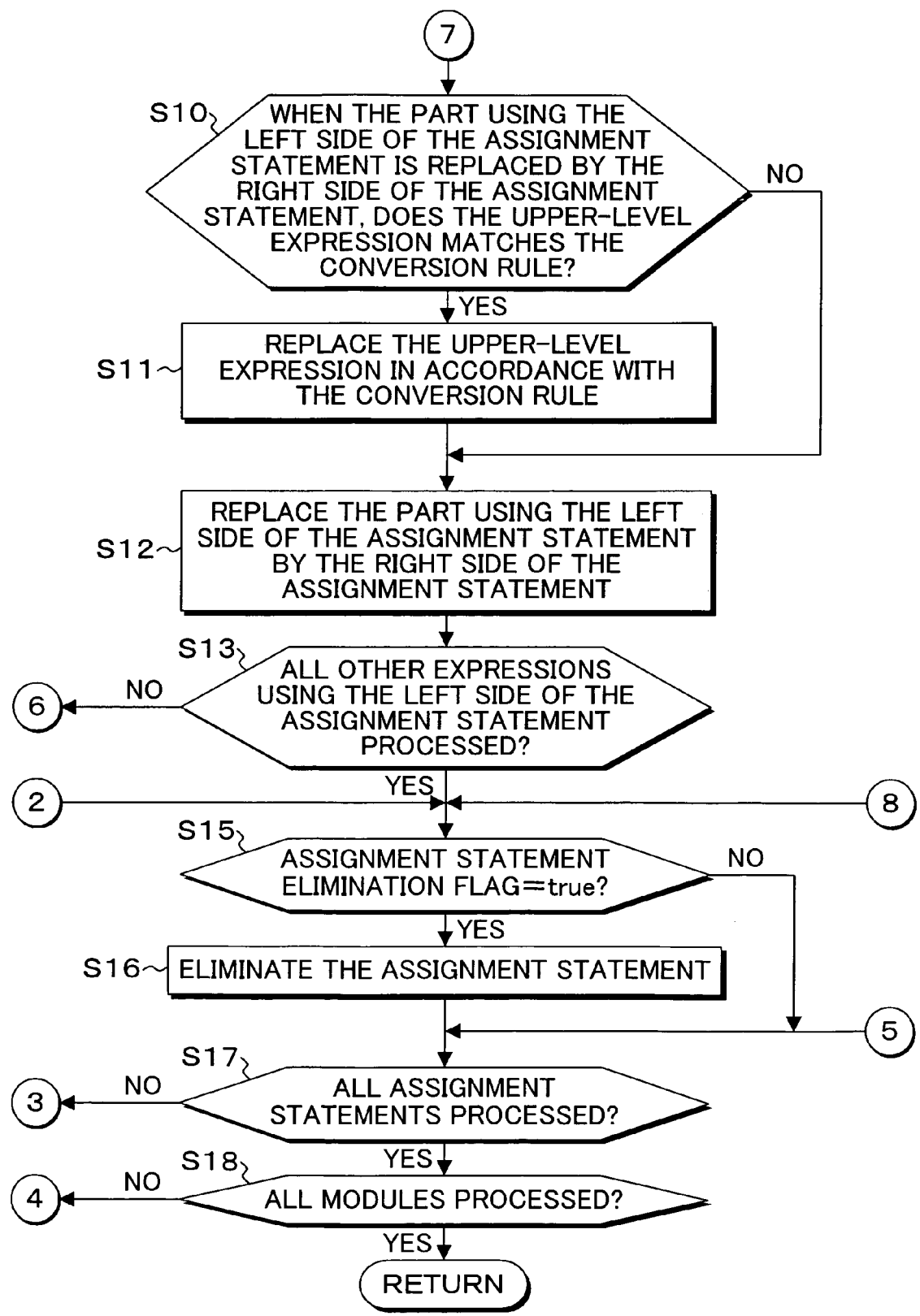
FIG. 26 is a flow chart of the assignment statement elimination process subsequent to FIGS. 25A and 25B.

FIGS. 25A, 25B and FIG. 26 are flow charts showing the assignment statement elimination process of step S4 of FIG. 10. The assignment statement elimination process is composed of three processes.

(1) Replacement process of assignment statements
(2) Conversion of expressions after assignment statements are replaced
(3) Replacement process of assignment statements to which delays are added First of all, the above described replacement process of assignment statements of (1) will be described with reference to a specific example of FIGS. 27A and 27B. FIG. 27A shows a hierarchical expansion work 60-4 in which assignment statements of processing objects are described. When focusing on the assignment statement of a 1st line in the hierarchical expansion work 60-4, the left side "net1" of the assignment work is used in the expression of the right side of the assignment statement of a 3rd line which is another expression. Therefore, "net1" in the expression of the right side of the assignment statement of the 3rd line is replaced by the right side "~(in1&in2)" of the assignment statement of the 1st line. Also, when focusing on the assignment statement of a 2nd line, "net2" which is the left side of this assignment statement is used in the expression of the right side of the assignment statement of the 3rd line which is another expression. Therefore, also in this case, "net2" in the expression of the right side of the assignment statement of the 3rd line is replaced by the right side "in1/in2" of the assignment statement of the 2nd line. Through such replacement of the assignment statements, replacement shown in a hierarchical expansion work 60-5 of FIG. 27B is performed, and the original assignment statements of the 1st line and the 2nd line can be eliminated. Next, the above described (2) conversion of the expressions after assignment statements are replaced will be described. In the process of replacement in the assignment statement elimination in the present embodiment, if there are trivial operations in the values of the expressions after the replacement, the operations are converted into further simplified operation expressions. In the conversion of the operations of the expressions, conversion rules shown in FIG. 28A are present. In the conversion rules 64 of FIG. 28A, seventeen examples are shows as item numbers, upper-level expressions, and conversion expressions. In the conversion rules 64, the upper-level expressions are the expressions which are generated in the replacement process of assignment statements, and specific operation expressions corresponding to the upper-level expressions are converted to simple operation expressions shown in the conversion expressions in the right side.

FIG. 28B is a symbol list 70 showing explanations of the symbols shown in the upper-level expressions and conversion expressions of the conversion rules 64. It goes without saying that, other than these, the symbol list 70 can employ symbols used in Verilog-HDL.

FIGS. 29A to 29D are specific examples in which the conversion rules 64 of FIG. 28A are used. When the assignment statement elimination process is performed on the three assignment statements shown in a hierarchical expansion work 60-6 of FIG. 29A, they can be replaced to the assignment statements of a hierarchical expansion work 60-7 of FIG. 29B. Furthermore, the right side "~in1&in1" of FIG. 29B corresponds to an upper-level expression "n&~n" indicated by an arrow 66 in the conversion rules 64 of FIG. 28A, the conversion expression in this case is "1'b0", and the right side will be "~1'b0" as shown in a hierarchical work 60-8 of FIG. 29C. Also, this operation corresponds to an upper-level expression "~1'b0" indicated by an arrow 67 in the conversion rules 64 of FIG. 28A, and the conversion expression in this case is "1'b1". Therefore, based on the conversion rules 64, the operation of the right side can be simplified by converting it to "1'b1" as shown in a hierarchical expansion work 60-9 of FIG. 29D.

Next, above described (3) process of assignment statements to which delays are added will be described with reference to FIGS. 30A to 30C. FIG. 30A is a hierarchical expansion work 60-10 in which assignment statements of processing objects are described, wherein a delay "#2" is added to an assignment statement of a 1st line, and a delay "#3" is added to an assignment statement of a 3rd line. Regarding such assignment statements to which the delays are added, when mere "net1" of the left side of the assignment statement of the 1st line which is a 1st assignment statement is used in the right sides of the 2nd line and the 3rd line which serve as a second assignment statement, the delay "#2" of the 1st assignment statement is added to the second assignment statement as shown in FIG. 30B. Therefore, the left side of the second assignment statement of the 1st line of FIG. 30B is "#2 out1" since the delay "#2" of the 1st assignment statement of the 1st line of FIG. 30A is added thereto, and "~net1" of the right side is replaced by "~(~in1)". The left side of the second assignment statement of the 2nd line of FIG. 30B is "#(3+2) out2" since the delay "#2" of the first assignment statement of the 1st line of FIG. 30A is added thereto, and the right side is similarly replaced by "~in1". A hierarchical expansion work 60-12 obtained from the result of addition of the delay "#2" of the right side of FIG. 30B is shown in FIG. 30C. Furthermore, the expression "~(~in1)" of the right side of the assignment statement of the 1st line after replacement of FIG. 28B corresponds to an upper-level expression "~~n" indicated by an arrow 68 in the conversion rules 64 of FIG. 28A, and the conversion expression in this case is "n". Therefore, the expression of the right side of the assignment statement of the 1st line of FIG. 30C is converted to "in1". The assignment statement elimination process according to the flow charts of FIGS. 25A, 25B and FIG. 26 which executes the assignment statement elimination processes shown in FIG. 27A to FIG. 30C in the above described manner will be described below. In FIGS. 25A and 25B, at first, a module in the logic circuit which has undergone the library hierarchical expansion is extracted in step S1, and an assignment statement in the module is extracted in step S2. Then, whether the left side of the assignment statement is input/output or not is checked in step S3. If it is input/output, it is excluded from objects; thus, the process proceeds to step S17 of FIG. 26. Then, in step S4, an assignment statement elimination flag is set to "true". Then, in step S5, whether the left side of the assignment statement is used in another expression or not is determined. If it is used, the other expression using the left side of the assignment statement is extracted in step S6. If it is not used, the process proceeds to step S15 of FIG. 26. Then, in step S7, whether a delay is added to the assignment statement or not is checked. If no delay is added, the process proceeds to step S10 of FIG. 26. If a delay is added, in step S8, it is checked whether or not that the other expression using the left side of the assignment statement (first assignment statement) is another assignment statement (second assignment statement), and the right side of the second assignment statement does not include any variable other than the left side of the first assignment statement. If the other expression is another assignment statement, and the right side thereof does not include any variable other than the left side of the first assignment statement, the delay of the first assignment statement is added to the delay of the second assignment statement in step S9. If the other expression is not another assignment statement or the right side of the second assignment statement includes a variable other than the left side of the first assignment statement, the process proceeds to step S14, in which the assignment statement elimination flag is set to "false", and the process proceeds to step S15 of FIG. 26. Subsequently, in step S10 of FIG. 26, if the part used in the other expression is replaced by the right side of the assignment statement, whether any upper-level expression matches any of the conversion rules or not is checked. If it is matched with a conversion rule, the upper-level expression is replaced in accordance with the conversion rule in step S11. Subsequently, in step S12, the part using the left side of the assignment statement is replaced by the right side of the assignment statement. Subsequently, in step S13, whether all other expressions using the left side of the assignment statement are processed or not is checked. If they are unprocessed, the process returns to step S6 of FIGS. 25A and 25B, similar processes are repeated for another expression. If all the other expressions using the left side of the assignment statement are processed in step S13, the process proceeds to step S15, in which whether the assignment statement elimination flag is "true" or not is checked; and, if so, the assignment statement is eliminated in step S16. Subsequently, whether all assignment statements are processed or not is checked in step S17; and, if they are unprocessed, the process returns to step S2 of FIGS. 25A and 25B, in which a next assignment statement in the module is extracted, and the processes from step S3 are repeated. When it is determined in step S17 of FIG. 26 that all the assignment statements are processed, the process proceeds to step S18, in which whether all the modules are processed or not is checked. If they are unprocessed, the process returns to step S1 of FIGS. 25A and 25B, in which a next module in the logic circuit is extracted, and the processes from step S2 are repeated. When all the modules are processed in step S18, the series of processes are terminated, and the process returns to the main routine of FIG. 10. Next, the process in which the logic circuit 14 of the netlist style HDL shown in FIG. 5 serves as an object to be converted by the logic circuit description style conversion system 10 of FIG. 1 to the logic circuit 28 of the RTL style shown in FIG. 8 will be described below with reference to FIG. 31 to FIG. 52.

FIG. 31 shows library expansions 72 and 74 of the instances MUX i1 and DFF i2 of the netlist style logic circuit 14 "module DESIGN" of FIG. 5. This library expansion is performed in accordance with the flow chart of FIGS. 13A and 13B. A module work 76-1 storing the hierarchical expansion result for the two instances of FIG. 31 is as shown in FIG. 32. The assignment statement elimination process shown in the flow charts of FIGS. 25A and 25B is performed for the module 76-1 which has undergone such library hierarchical expansion in the following manner.

FIG. 33 is an assignment statement elimination process for the module work 76-1 of FIG. 32, wherein the processes of steps S1 to S4 are performed. Regarding the processing objects of steps S1 to S4, processing parts are indicated by arrows in the module work 76-1. In the assignment statement elimination process 78, "loop 2, loop 3" correspond to the flow chart of the assignment statement elimination process of FIGS. 25A and 25B. Herein, the assignment statement process of FIGS. 25A and 25B can be separated into the following three loops 1 to 3 as processing loops.
Loop 1: processes of steps S1 to S18
Loop 2: processes of steps S2 to S17
Loop 3: processes of steps S6 to S13

In the assignment statement elimination process 78 of FIG. 33, at first, attention is focused on the assignment statement of a 10th line of the module work 76-1 of FIG. 32 in the process of the loop 2 in step S1, and attention is focused on the expression of the 17th line using the left side "i1_a" of the assignment statement. Subsequently, in step S3, the expression of the 17th line "(i1_a&i1_s)|(i1_b&~i1_s)" is replaced by the assignment statement of the 10th line so that it is "(d&i1_s)|(i1_b&~i1_s)". Subsequently, in step S4, since all the part using "i1_a" is replaced, a wire declaration of the 9th line and the assignment statement of the 10th line are eliminated. The contents of a module work 76-2 of FIG. 34 are provided through the assignment statement elimination process 78 of FIG. 33.

Then, an assignment statement elimination process 80 of FIG. 35 is executed for the module work 76-2. In the assignment statement elimination process 80, in step S5, attention is focused on an assignment statement of a 10th line of FIG. 34 by the process of loop 2; and subsequently, in step S6, attention is focused on an expression of a 15th line using "i1_b" of the left side of the assignment statement of the 10th line by the process of loop 3. Subsequently, in step S7, the expression "(d&i1_s)|(i1_b&~i1_s)" of the 15th line is replaced by the assignment statement of the 10th line to provide "(d&i1_s)|(qb&~i1_s)". Subsequently, in step S8, since all the part using "i1_b" has been replaced, a wire declaration of a 9th line and the assignment statement of the 10th line are eliminated. The contents of a module work 76-3 of FIG. 36 are provided through the assignment statement elimination process 80 of FIG. 35.

Then, the module work 76-3 of FIG. 36 is processed by an assignment statement elimination process 82 of FIG. 37. At first, in step S9, attention is focused on an assignment statement of a 10th line by the process of loop 2; and, in step S10, attention is focused on an expression of a 13th line using the left side "i1_s" of the assignment statement of the 10th line by the process of loop 3. Then, in step S11, the expression "(d&i1_s)|(qb&~i1_s)" of the 13th line is replaced by the assignment statement of the 10th line to provide "(d&s)|(qb&~s)". Subsequently, in step S12, since all the part using "i1_s" has been replaced, a wire declaration of a 9th line and the assignment statement of the 10th line are eliminated. As a result, the contents of a module work 76-4 of FIG. 38 are provided.

Then, the module work 76-4 of FIG. 38 is processed by an assignment statement elimination process 84 of FIG. 39. At first, in step S13, attention is focused on an assignment statement of a 10th line by the process of loop 2; and, in step S14, attention is focused on an expression of a 13th line using the left side "n" of the assignment statement of the 10th line. Then, in step S15, the expression "n" of the 13th line is replaced by the assignment statement of the 10th line to provide "i1_o". Subsequently, in step S16, since all the part using "n" has been replaced, a wire declaration of a 7th line and the assignment statement of the 10th line are eliminated. As a result, the contents shown in a module work 76-5 of FIG. 40 are obtained.

Then, an assignment statement elimination process 86 of FIG. 41 is performed for the module work 76-5 of FIG. 40. In the assignment statement elimination process 86, in step S17, attention is focused on an assignment statement of a 9th line by the process of loop 2; and, in step S18, attention is focused on an expression of an 11th line using the left side "i_o" of the assignment statement of the 9th line by the process of loop 3.

Then, in step S19, the expression "i1_o" of the 11th line is replaced by the assignment statement of the 9th line to provide "(d&s)|(qb&~s)". Subsequently, in step S20, since all the part using "i1_o" has been replaced, a wire declaration of an 8th line and the assignment statement of the 9th line are eliminated. As a result, the contents of a module work 76-6 of FIG. 42 are obtained.

Then, an assignment statement elimination process 88 of FIG. 43 is performed. At first, in step S21, attention is focused on an assignment statement of a 9th line of FIG. 42 by the process of loop 2; and, in next step S22, attention is focused on an expression of the 22nd line using the left side "i2_d" of the assignment statement of the 9th line by the process of loop 3. Then, in step S23, the expression "i2_q" of a 22nd line is replaced by the assignment statement of the 9th line to provide "(d&s)|(qb&~s)". Then, in step S24, since all the part using "i2_d" has been replaced, a wire declaration of an 8th line and the assignment statement of the 9th line are eliminated. As a result, a module work 76-7 of FIG. 44 is obtained.

Then, an assignment statement elimination process 90 of FIG. 45 is performed. At first, in step S25, attention is focused on an assignment statement of a 9th line of FIG. 44 by the process of loop 2. Subsequently, in step S26, attention is focused on an expression of a 16th line using the left side "i2_c" of the assignment statement of the 9th line by the process of loop 3. Then, in S27, the expression "posedge i2_c or negedge i2_r" of the 16th line is replaced by the assignment statement of the 9th line to provide "posedge c or negedge i2_r". Then, in step S28, since all the part using "i2_c" has been replaced, a wire declaration of an 8th line and the assignment statement of the 9th line are eliminated. As a result, a module work 76-8 of FIG. 46 is obtained.

Then, an assignment statement elimination process 92 of FIG. 47 is performed. At first, in step S29, attention is focused on an assignment statement of a 9th line of FIG. 46 by the process of loop 2; and, in step S30, attention is focused on an expression of a 14th line and an expression of a 15th line using the left side "i2_r" of the assignment statement by the process of loop 3. Then, in step S31, the expression "posedge c or negedge i2_r" of the 14th line is replaced by the assignment statement of the 9th line to provide "posedge c or negedge r". The expression "i2_r==1'b0" of the 15th line is similarly replaced to provide "r==1'b0". Then, in step S32, since all the part using "i2_r" has been replaced, a wire declaration of an 8th line and the assignment statement of the 9th line are eliminated. As a result, a module work 76-9 of FIG. 48 is obtained.

Then, an assignment statement elimination process 94 of FIG. 49 is performed. At first, in step S33, attention is focused on an assignment statement of a 9th line of FIG. 48. In step S34, the left side "q" of the assignment statement of FIG. 48 is an assignment statement that cannot be eliminated since it is input/output, and it is excluded by the process of loop 3. Then, in step S35, attention is focused on an assignment statement of an 11th line by the process of loop 2; and, in step S36, attention is focused on an expression of a 16th line using the left side "qb" of the assignment statement by the process of loop 3. Then, in step S37, the expression "(d&s)|(qb&~s)" of the 16th line is replaced by the assignment statement of the 11th line to provide "(d&s)|(i2_qb&~s)". Finally, in step S38, since all the part using "qb" has been replaced, a wire declaration of a 7th line and the assignment statement of 11th line are eliminated. As a result, a module work 76-10 of FIG. 50 is obtained.

Then, an assignment statement elimination process 96 of FIG. 51 is performed. At first, in step S39, attention is focused on an assignment statement of a 15th line of FIG. 50. Then, in step S40, attention is focused on an expression of a 14th line by the process of loop 2. Then, in step S41, the expression "(d&s)|(i2_qb&~s)" of the 14th line is replaced by the assignment statement of the 15th line to provide "(d&s)|(~i2_q&~s)". Finally, in step S42, since all the part using "i2_qb" has been replaced, a wire declaration of a 9th line and the assignment statement of the 15th line are eliminated. As a result, a module work 76-11 of FIG. 52 is finally obtained.

The finally obtained module work 76-11 of FIG. 52 is same as the RTL style logic circuit 28 of FIG. 8, and it can be understood that the module DESIGN which is the netlist style logic circuit 14 of FIG. 5 has been converted to the RTL style through the series of processes. Then, the process in which the library 30 of the netlist style HDL shown in FIGS. 6A and 6B is converted to the RTL style HDL library 16 shown in FIG. 7 by the library description style conversion system 12 of FIG. 3 will be described below with reference to FIG. 53 to FIG. 82.

FIG. 53 shows library hierarchical expansions 100, 102, 104, and 106 of the instances NOT i1, AND i2, AND i3, and OR i4 of "module MUX" in the library 30 of FIGS. 6A and 6B. The library hierarchical expansion is performed in accordance with the flow chart of FIGS. 13A and 13B. A module work 108-1 storing the library hierarchical expansion with respect to the four instances of FIG. 53 is as shown in FIG. 54. The assignment statement elimination process shown in FIGS. 25A and 25B is performed in the following manner for the module work 108-1 which has undergone such library hierarchical expansion.

FIG. 55 is an assignment statement elimination process for the module work 108-1 of FIG. 54, wherein the processes of steps S1 to S4 are performed, and processing parts regarding the processing objects of steps S1 to S4 are indicated by arrows in the module work 108-1 of FIG. 54. In the assignment statement elimination process 110, "loop 2, loop 3" correspond to the flow chart of the assignment statement elimination process of FIGS. 25A and 25B. Furthermore, the numbers shown in the left of the module work 108-1 of FIG. 54 are line numbers. Herein, the assignment statement elimination process of FIGS. 25A and 25B can be separated into the following three loops.

Loop 1: processes of steps S1 to S18
Loop 2: processes of steps S2 to S17
Loop 3: processes of steps S6 to S13

In the assignment statement elimination process 110 of FIG. 55, at first, in step S1, attention is focused on an assignment statement of a 10th line of FIG. 54 by the process of loop 2; and, in step S2, attention is focused on an expression of a 13th line using the left side "i1_a" of the assignment statement. Subsequently, in step S3, the expression "~i1_a" of the 13th line is replaced by the assignment statement of the 10th line to provide "~s". Subsequently, in step S4, since all the part using "i1_a" has been replaced, a wire declaration of a 9th line and the assignment statement of the 10th line are eliminated. The contents of a module work 108-2 of FIG. 56 are provided through the assignment statement elimination process 110 of FIG. 55.

Then, an assignment statement elimination process of 112 of FIG. 57 is executed for the module work 108-2 of FIG. 56. In the assignment statement elimination process 112, in step S5, attention is focused on an assignment statement of a 10th line of FIG. 56 by the process of loop 2; and, subsequently in step S6, attention is focused on an expression of a 22nd line using the left side "s1" of the assignment statement of the 10th line. Subsequently, in step S7, the expression "s1" of the 22nd line is replaced by the assignment statement of the 10th line to provide "i1_o". Subsequently, in step S8, since all the part using "s1" has been replaced, a wire declaration of an 8th line and the assignment statement of the 10th line are eliminated. The contents of a module work 108-3 of FIG. 58 are provided through the assignment statement elimination process 112 of FIG. 57.

Then, the module work 108-3 of FIG. 58 is processed by an assignment statement elimination process 114 of FIG. 59. At first, in step S9, attention is focused on an assignment statement of a 9th line by the process of loop 2; and, in step S10, attention is focused on an expression of a 20th line using the left side "i1_o" of the assignment statement of the 9th line by the process of loop 3. Then, in step S11, the expression "i1_o" of the 20th line is replaced by the assignment statement of the 9th line to provide "~s". Subsequently, in step S12, since all the part using "i1_o" has been replaced, a wire declaration of an 8th line and the assignment statement of the 9th line are eliminated. As a result, the contents of a module work 108-4 of FIG. 60 are provided.

Then, the module work 108-4 of FIG. 60 is processed by an assignment statement elimination process 116 of FIG. 61. At first, in step S13, attention is focused on an assignment statement of a 9th line by the process of loop 2; and, in step S14, attention is focused on an expression of a 14th line using the left side "i2_a" of the assignment statement of the 9th line. Then, in step S15, the expression "i2_a&i2_b" of the 14th line is replaced by the assignment statement of the 9th line to provide "a&i2_b". Subsequently, in step S16, since all the part using "i2_a" has been replaced, a wire declaration of an 8th line and the assignment statement of the 9th line are eliminated. As a result, the contents shown in a module work 108-5 of FIG. 62 are obtained. Then, an assignment statement elimination process 118 of FIG. 63 is performed for the module work 108-5. In the assignment statement elimination process 118, in step S17, attention is focused on an assignment statement of a 9th line by the process of loop 2; and, in step S18, attention is focused on an expression of a 12th line using the left side "i2_b" of the assignment statement of the 9 the line by the process of loop 3. Then, in step S19, the expression "a&i2_b" of the 12th line is replaced by the assignment statement of the 9th line to provide "a&s". Subsequently, in step S20, since all the part using "i2_b" has been replaced, a wire declaration of 8th line and the assignment statement of the 9th line are eliminated. As a result, the contents of a module work 108-6 of FIG. 64 are obtained.

Then, an assignment statement elimination process 120 of FIG. 65 is performed. At first, in step S21, attention is focused on an assignment statement of a 9th line of FIG. 64 by the process of loop 2; and, in next step S22, attention is focused on an expression of a 19th line using the left side "a1" of the assignment statement of the 9th line by the process of loop 3. Then, in step S23, the expression "a1" of the 19th line is replaced by the assignment statement of the 9th line to provide "i2_0". Then, in step S24, since all the part using "a1" has been replaced, a wire declaration of a 6th line and the assignment statement of the 9th line are eliminated. As a result, a module work 108-7 of FIG. 66 is obtained.

Then, an assignment statement elimination process 122 of FIG. 67 is performed. At first, in step S25, attention is focused on an assignment statement of an 8th line of FIG. 66 by the process of loop 2. Subsequently, in step S26, attention is focused on an expression of a 17th line using the left side "i2_o" of the assignment statement of the 8th line by the process of loop 3. Then, in step S27, the expression "i2_o" of the 17th line is replaced by the assignment statement of the 8th line to provide "a&s". Then, in step S28, since all the part using "i2_o" has been replaced, a wire declaration of a 7th line and the assignment statement of the 8th line are eliminated. As a result, a module work 108-8 of FIG. 68 is obtained.

Figure 70:
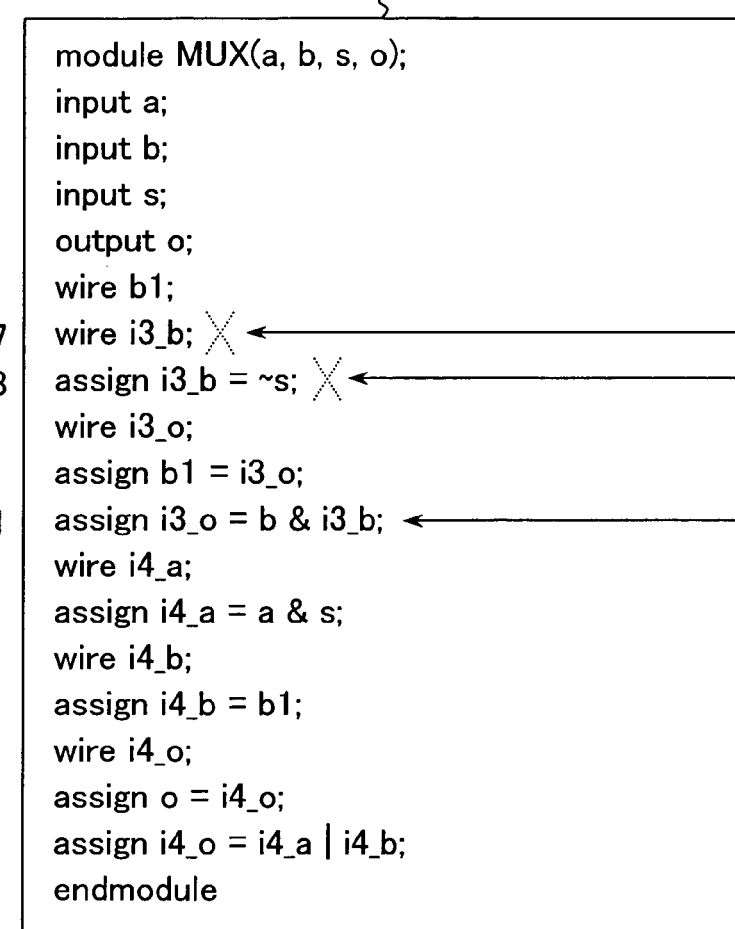
FIG. 70 is an explanatory diagram of the module work generated by the process of FIG. 69.

Then, an assignment statement elimination process 124 of FIG. 69 is performed. At first, in step S29, attention is focused on an 8th line of FIG. 68 by the process of loop 2; and, in step S30, attention is focused on an expression of a 13th line using the left side "i3_a" of the assignment statement by the process of loop 3. Then, in step S31, the expression "i3_a&i3_b" is replaced by the assignment statement of the 8th line to provide "b&i3_b". Then, in step S32, since all the part using "i3_a" has been replaced, a wire declaration of a 7th line and the assignment statement of the 8th line are eliminated. As a result, a module work 108-9 of FIG. 70 is obtained.

Then, an assignment statement elimination process 126 of FIG. 71 is performed. At first, in step S33, attention is focused on an 8th line of FIG. 70; and, in step S34, attention is focused on an expression of an 11th line using the left side "i3_b" of the assignment statement. Then, in step S35, the expression "b&i3_b" of the 11th line is replaced by the assignment statement of the 8th line to provide "b&~s". Then, in step S36, since all the part using "i3_b" has been replaced, a wire declaration of a 7th line and the assignment statement of the 8th line are eliminated. As a result, a module work 108-10 of FIG. 72 is obtained.

Then, an assignment statement elimination process 128 of FIG. 73 is performed. At first, in step S37, attention is focused on an assignment statement of an 8th line of FIG. 72 by the process of loop 2; and, in step S38, attention is focused on an expression of a 13th line using the left side "b1" of the assignment statement.

Then, in step S39, the expression "b1" of the 13th line is replaced by the assignment statement of the 8th line to provide "i3_o". Then, in step S40, since all the part using "b1" has been replaced, a wire declaration of a 6th line and the assignment statement of the 8th line are eliminated. As a result, a module work 108-11 of FIG. 74 is obtained.

Then, an assignment statement elimination process 130 of FIG. 75 is performed. At first, in step S41, attention is focused on an assignment statement of a 7th line of FIG. 74 by the process of loop 2; and, in step S42, attention is focused on an expression of an 11th line using the left side "i3_o" of the assignment statement. Then, in step S43, the expression "i3_o" of the 11th line is replaced by the assignment statement of the 7th line to provide "b&~s". Then, in step S44, since all the part using "i3_o" has been replaced, a wire declaration of a 6th line and the assignment statement of the 7th line are eliminated. As a result, a module work 108-12 of FIG. 76 is obtained.

Then, an assignment statement elimination process 132 of FIG. 77 is performed. At first, in step S45, attention is focused on an assignment statement of a 7th line of FIG. 76 by the process of loop 2; and, in step S46, attention is focused on an expression of a 12th line using the left side "i4_a" of the assignment statement. Then, in step S47, the expression "i4_a|i4_b" of the 12th line is replaced by the assignment statement of the 7th line to provide "(a&s)|i4_b". Then, in step S48, since all the part using "i4_a" has been replaced, a wire declaration of a 6th line and the assignment statement of the 7th line are eliminated. As a result, a module work 108-13 of FIG. 78 is obtained.

Figure 80:
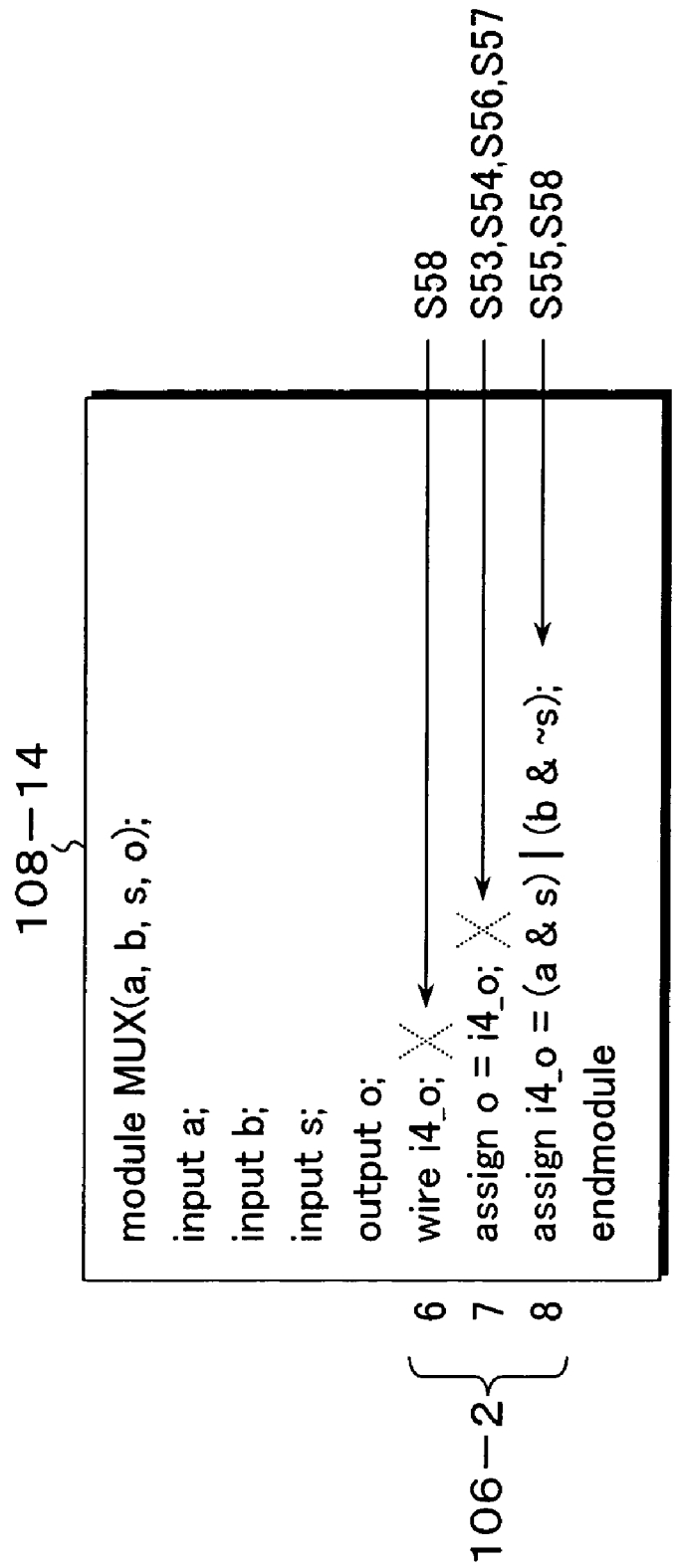
FIG. 80 is an explanatory diagram of the module work generated by the process of FIG. 79.

Then, an assignment statement elimination process 134 of FIG. 79 is performed. At first, in step S49, attention is focused on an assignment statement of a 7th line of FIG. 78 by the process of loop 2; and, in step S50, attention is focused on an expression of a 10th line using the left side "i4_b" of the assignment statement by the process of loop 3. Then, in step S51, the expression "(a&s)|i4_b" of the 10th line is replaced by the assignment statement of the 7th line to provide "(a&s)|(b&~s)". Then, in step S52, since all the part using "i4_b" has been replaced, a wire declaration of a 6th line and the assignment statement of the 7th line are eliminated. As a result, a module work 108-14 of FIG. 80 is obtained.

Then, an assignment statement elimination process 136 of FIG. 81 is performed. At first, in step S53, attention is focused on an assignment statement of a 7th line of FIG. 80 by the process of loop 2. In step S54, since the left side "o" of the assignment statement of the 7th line of FIG. 80 is input/output, it is an assignment statement which cannot be eliminated, and it is excluded in the process of loop 3. Then, in step S55, attention is focused on an assignment statement of an 8th line by the process of loop 2; and, in step S56, attention is focused on an expression of a 7th line using the left side "i4_o" of the assignment statement by the process of loop 3. Then, the expression "i4_o" of the 7th line is replaced by the assignment statement of the 8th line to provide "(a&s)|(b&~s)". Finally, in step S58, since all the part using "i4_o" has been replaced, a wire declaration of a 6th line and the assignment statement of the 8th line are eliminated. As a result, a module work 108-15 of FIG. 82 is finally obtained.

The finally obtained module work 108-15 of FIG. 82 is same as the 1st to 7th lines of the RTL style library 16 of FIG. 7. It can be understood that the module MUX of the 1st to 13th lines of the netlist style library 30 of FIGS. 6A and 6B has been converted to the RTL style through the series of processes. Moreover, the present invention provides a recording medium storing a computer-readable program for HDL description style conversion according to the present embodiment. Herein, the recording medium includes a portable storage medium such as a CD-ROM, floppy (R) disk FD, a DVD disk, a magneto-optical disk, or an IC card, a storage device such as a hard disk HDD provided in or outside a computer system, a database which retains the program via a line, another computer system PC and a database thereof. The present invention is not limited to the above described embodiments and includes arbitrary modifications that do not impair the object and advantages thereof. Furthermore, no limitation is imposed thereon by the numerical values shown in the above described embodiments.

What is claimed is:

1. A description style conversion method of a logic circuit which converts the logic circuit described in a netlist style to a logic circuit described in an RTL style by using a hardware description language, the description style conversion method characterized by including a logic circuit reading step in which the logic circuit described in the netlist style is read;

a library reading step in which a lower-level logic circuit described in the RTL style of a library corresponding to an instance in the logic circuit is read;

a library hierarchical expansion step in which a process of expanding a hierarchy of the library is performed for the instance in the logic circuit, and the logic circuit is converted to the RTL style;

an assignment statement elimination step in which an assignment statement in the logic circuit is replaced and eliminated; and a logic circuit output step in which the logic circuit is output in the RTL style.

2. The description style conversion method of the logic circuit according to claim 1, characterized by including, if the logic circuit of the library is described in the netlist style, a library description style conversion step in which the logic circuit is converted to the RTL style.

3. The description style conversion method of the logic circuit according to claim 2, characterized in that the library description style conversion step includes a logic circuit reading step in which the logic circuit described in the netlist style in a library is read;

a lower-level logic circuit reading step in which the lower-level logic circuit in the library described in the RTL style is read with respect to the instance in the logic circuit;

a library hierarchical expansion step in which a process of expanding a hierarchy of the lower-level logic circuit is performed for the instance in the logic circuit, and the logic circuit is converted to the RTL style;

an assignment statement elimination step in which the assignment statement in the logic circuit is replaced and eliminated; and a module output step in which the logic circuit is output in the RTL style, and the library is rewritten.

4. The description style conversion method of the logic circuit according to claim 1, characterized in that the library hierarchical expansion step includes a library specifying step in which the lower-level logic circuit in the library corresponding to the instance in the logic circuit is specified;

a joining step in which, with respect to the instance in the logic circuit, a joining relation between an instance pin and a library port of the lower-level logic circuit in the library corresponding to the instance pin is set;

a declaration copy step in which a data-type declaration except for input/output is extracted from the lower-level logic circuit in the library, and a copy of the declaration is generated;

a function description copy step in which a function description is extracted from the lower-level logic circuit in the library, and a copy of the function description is generated;

a task description copy step in which a task description is extracted from the lower-level logic circuit in the library, and a copy of the task description is generated; and a behavioral description copy step in which a behavioral description is extracted from the lower-level logic circuit in the library, and a copy of the behavioral description is generated.

5. The description style conversion method of the logic circuit according to claim 4, characterize in that, if the hardware description language is Verilog-HDL, in the joining step, if the library port is an input port, wire library port name;

assign library port name=expression of instance pin;

are generated corresponding to the instance pin, and, if the library port is an output port, wire library port name;

assign expression of instance pin=library port name;

are generated corresponding to the instance pin; and a name in which the instance name of the logic circuit is connected by an underscore with the library port name before conversion is generated as the library port name.

6. The description style conversion method of the logic circuit according to claim 4, characterized in that, if the hardware description language is Verilog-HDL, in the declaration copy step, a name in which the instance name of the logic circuit is connected by an underscore with the declaration name before conversion is generated as a declaration name of a copy destination;

in the function description copy step, a name in which the instance name of the logic circuit is connected by an underscore with the function name before conversion is generated as a function name of a copy destination;

in the task description copy step, a name in which the instance name of the logic circuit is connected by an underscore with the task name before conversion is generated as a task name of a copy destination;

in the instance description copy step, a name in which the instance name of the logic circuit is connected by an underscore with the instance name before conversion is generated as an instance name of a copy destination, and a name in which the instance name of a module is connected by an underscore with a variable name before conversion is generated as a variable name in the expression of the instance pin; and, in the behavioral description copy step, an initial statement, an always statement, and an assign statement are extracted as the behavioral description statements from the lower-level logic circuit in the library, and a copy of the statements is generated.

7. The description style conversion method of the logic circuit according to claim 1, characterized in that, in the assignment statement elimination step, if the left side of the assignment statement is used in another expression, the part used in the other expression is replaced by the right side of the assignment statement, and the assignment statement is eliminated.

8. The description style conversion method of the logic circuit according to claim 7, characterized in that, in the assignment statement elimination step, if the other expression replaced by the right side of the assignment statement is an operation expression, the operation expression is converted to a simplified operation expression in accordance with a predetermined conversion rule.

9. The description style conversion method of the logic circuit according to claim 1, characterized in that, in the assignment statement elimination step, if a delay is added to the left side of a first assignment statement, and mere the left side of the first assignment statement is used in the right side of a second assignment statement, the delay of the first assignment statement is added to the second assignment statement, the part used in the right side of the second assignment statement is replaced by the right side of the first assignment statement, and the first assignment statement is eliminated.

10. A computer-readable storage medium which stores a program characterized by causing a computer to execute a logic circuit reading step in which a logic circuit described in a netlist style is read by using a hardware description language;

a library reading step in which a lower-level logic circuit described in an RTL style of a library corresponding to an instance in the logic circuit is read;

a library hierarchical expansion step in which a process of expanding a hierarchy of the library is performed for the instance in the logic circuit, and the logic circuit is converted to the RTL style;

an assignment statement elimination step in which an assignment statement in the logic circuit is replaced and eliminated; and a logic circuit output step in which the logic circuit is output in the RTL style.

11. The storage medium according to claim 10, characterized by including, if the logic circuit of the library is described in the netlist style, a library description style conversion step in which the logic circuit is converted to the RTL style; wherein the library description style conversion step includes a logic circuit reading step in which the logic circuit described in the netlist style in a library is read;

a lower-level logic circuit reading step in which the lower-level logic circuit in the library described in the RTL style is read with respect to the instance in the logic circuit;

a library hierarchical expansion step in which a process of expanding a hierarchy of the lower-level logic circuit is performed for the instance in the logic circuit, and the logic circuit is converted to the RTL style;

an assignment statement elimination step in which the assignment statement in the logic circuit is replaced and eliminated; and a module output step in which the logic circuit is output in the RTL style, and the library is rewritten.

12. The storage medium according to claim 10, characterized in that the library hierarchical expansion step includes a library specifying step in which the lower-level logic circuit in the library corresponding to the instance in the logic circuit is specified;

a joining step in which, with respect to the instance in the logic circuit, a joining relation between an instance pin and a library port of the lower-level logic circuit in the library corresponding to the instance pin is set;

a declaration copy step in which a data-type declaration except for input/output is extracted from the lower-level logic circuit in the library, and a copy of the declaration is generated;

a function description copy step in which a function description is extracted from the lower-level logic circuit in the library, and a copy of the function description is generated; a task description copy step in which a task description is extracted from the lower-level logic circuit in the library, and a copy of the task description is generated; and a behavioral description copy step in which a behavioral description is extracted from the lower-level logic circuit in the library, and a copy of the behavioral description is generated.

13. The storage medium according to claim 12, characterize in that, if the hardware description language is Verilog-HDL, in the joining step, if the library port is an input port, wire library port name;

assign library port name=expression of instance pin;

are generated corresponding to the instance pin, and, if the library port is an output port, wire library port name;

assign expression of instance pin=library port name;

are generated corresponding to the instance pin; and a name in which the instance name of the logic circuit is connected by an underscore with the library port name before conversion is generated as the library port name.

14. The storage medium according to claim 12, characterized in that, if the hardware description language is Verilog-HDL, in the declaration copy step, a name in which the instance name of the logic circuit is connected by an underscore with the declaration name before conversion is generated as a declaration name of a copy destination;

in the function description copy step, a name in which the instance name of the logic circuit is connected by an underscore with the function name before conversion is generated as a function name of a copy destination;

in the task description copy step, a name in which the instance name of the logic circuit is connected by an underscore with the task name before conversion is generated as a task name of a copy destination;

in the instance description copy step, a name in which the instance name of the logic circuit is connected by an underscore with the instance name before conversion is generated as an instance name of a copy destination, and a name in which the instance name of a module is connected by an underscore with a variable name before conversion is generated as a variable name in the expression of the instance pin; and, in the behavioral description copy step, an initial statement, an always statement, and an assign statement are extracted as the behavioral description statements from the lower-level logic circuit in the library, and a copy of the statements is generated.

15. The storage medium according to claim 10, characterized in that, in the assignment statement elimination step, if the left side of the assignment statement is used in another expression, the part used in the other expression is replaced by the right side of the assignment statement, and the assignment statement is eliminated.

16. The storage medium according to claim 15, characterized in that, in the assignment statement elimination step, if the other expression replaced by the right side of the assignment statement is an operation expression, the operation expression is converted to a simplified operation expression in accordance with a predetermined conversion rule.

17. The storage medium according to claim 10, characterized in that, in the assignment statement elimination step, if a delay is added to the left side of a first assignment statement, and mere the left side of the first assignment statement is used in the right side of a second assignment statement, the delay of the first assignment statement is added to the second assignment statement, the part used in the right side of the second assignment statement is replaced by the right side of the first assignment statement, and the first assignment statement is eliminated.

18. A description style conversion system of a logic circuit which converts the logic circuit described in a netlist style to a logic circuit described in an RTL style by using a hardware description language, the description style conversion system characterized by including a logic circuit reading unit which reads the logic circuit described in the netlist style;

a library reading unit which reads a lower-level logic circuit described in the RTL style of a library corresponding to an instance in the logic circuit;

a library hierarchical expansion unit which performs a process of expanding a hierarchy of the library for the instance in the logic circuit, and converts the logic circuit to the RTL style;

an assignment statement elimination unit which replaces and eliminates an assignment statement in the logic circuit; and a logic circuit output unit which outputs the logic circuit in the RTL style.

19. The description style conversion system of the logic circuit according to claim 18, characterized by having, if the logic circuit of the library is described in the netlist style, a library description style conversion unit which converts the logic circuit to the RTL style;

wherein
the library description style conversion unit has
a logic circuit reading unit which reads the logic circuit described in the netlist style in a library;
a lower-level logic circuit reading unit which reads the lower-level logic circuit in the library described in the RTL style with respect to the instance in the logic circuit;
a library hierarchical expansion unit which performs a process of expanding a hierarchy of the lower-level logic circuit for the instance in the logic circuit, and converts the logic circuit to the RTL style;
an assignment statement elimination unit which replaces and eliminates the assignment statement in the logic circuit; and
a module output unit which outputs the logic circuit in the RTL style and rewrites the library.

20. The description style conversion system of the logic circuit according to claim 18, characterized in that the library hierarchical expansion unit has a library specifying unit which specifies the lower-level logic circuit in the library corresponding to the instance in the logic circuit;

a joining unit which sets, with respect to the instance in the logic circuit, a joining relation between an instance pin and a library port of the lower-level logic circuit in the library corresponding to the instance pin;

a declaration copy unit which extracts a data-type declaration except for input/output from the lower-level logic circuit in the library and generates a copy of the declaration;

a function description copy unit which extracts a function description from the lower-level logic circuit in the library and generates a copy of the function description;

a task description copy unit which extracts a task description from the lower-level logic circuit in the library and generates a copy of the task description; and a behavioral description copy unit which extracts a behavioral description from the lower-level logic circuit in the library and generates a copy of the behavioral description.

21. The description style conversion system of the logic circuit according to claim 18, characterized in that, the assignment statement elimination unit, if the left side of the assignment statement is used in another expression, replaces the part used in the other expression by the right side of the assignment statement and eliminates the assignment statement;

if the other expression replaced by the right side of the assignment statement is an operation expression, converts the operation expression to a simplified operation expression in accordance with a predetermined conversion rule; and if a delay is added to the left side of a first assignment statement, and mere the left side of the first assignment statement is used in the right side of a second assignment statement, adds the delay of the first assignment statement to the second assignment statement, replaces the part used in the right side of the second assignment statement by the rightside of the first assignment statement, and eliminates the first assignment statement.

* * * * *

UNITED STATES PATENT AND TRADEMARK OFFICE
CERTIFICATE OF CORRECTION

PATENT NO.        : 7,472,371 B2
APPLICATION NO.   : 11/540654
DATED             : December 30, 2008
INVENTOR(S)       : Eiji Furukawa Page 1 of 1

It is certified that error appears in the above-identified patent and that said Letters Patent is hereby corrected as shown below:

Column 1, Line 6, change "Jun. 16," to --Jun. 29,--.

Column 24, Line 45, change "characterize" to --characterized--.

Column 26, Lines 41-42, change "characterize" to --characterized--.

Column 28, Line 59, change "rightside" to --right side--.

Signed and Sealed this

Thirty-first Day of March, 2009

JOHN DOLL
*Acting Director of the United States Patent and Trademark Office*